(12) United States Patent
Oikawa et al.

(10) Patent No.: US 11,127,732 B2
(45) Date of Patent: *Sep. 21, 2021

(54) SEMICONDUCTOR DEVICE

(71) Applicant: Semiconductor Energy Laboratory Co., Ltd., Kanagawa-ken (JP)

(72) Inventors: Yoshiaki Oikawa, Tochigi (JP); Shingo Eguchi, Tochigi (JP)

(73) Assignee: Semiconductor Energy Laboratory Co., Ltd.

(*) Notice: Subject to any disclaimer, the term of this patent is extended or adjusted under 35 U.S.C. 154(b) by 22 days.

This patent is subject to a terminal disclaimer.

(21) Appl. No.: 16/028,992

(22) Filed: Jul. 6, 2018

(65) Prior Publication Data
US 2018/0315745 A1 Nov. 1, 2018

Related U.S. Application Data

(60) Continuation of application No. 14/929,715, filed on Nov. 2, 2015, now Pat. No. 10,020,296, which is a
(Continued)

(30) Foreign Application Priority Data

Sep. 18, 2008 (JP) .................. 2008-239075
Sep. 18, 2008 (JP) .................. 2008-239078

(51) Int. Cl.
*H01L 27/02* (2006.01)
*H01L 27/12* (2006.01)
(Continued)

(52) U.S. Cl.
CPC .......... *H01L 27/0248* (2013.01); *H01L 23/66* (2013.01); *H01L 27/1214* (2013.01);
(Continued)

(58) Field of Classification Search
None
See application file for complete search history.

(56) References Cited

U.S. PATENT DOCUMENTS

| 5,075,166 A | 12/1991 | Sikorski et al. |
| 5,597,631 A | 1/1997 | Furumoto et al. |

(Continued)

FOREIGN PATENT DOCUMENTS

| EP | 1 227 434 A1 | 7/2002 |
| EP | 1 818 860 A2 | 8/2007 |

(Continued)

OTHER PUBLICATIONS

International Search Report re Application No. PCT/JP2009/065127, dated Dec. 1, 2009.
(Continued)

*Primary Examiner* — Hrayr A Sayadian
(74) *Attorney, Agent, or Firm* — Husch Blackwell LLP

(57) ABSTRACT

To solve a problem in that an antenna or a circuit including a thin film transistor is damaged due to discharge of electric charge accumulated in an insulator (a problem of electrostatic discharge), a semiconductor device includes a first insulator, a circuit including a thin film transistor provided over the first insulator, an antenna which is provided over the circuit and is electrically connected to the circuit, and a second insulator provided over the antenna, a first conductive film provided between the first insulator and the circuit, and a second conductive film provided between the second insulator and the antenna.

16 Claims, 19 Drawing Sheets

Related U.S. Application Data division of application No. 12/556,229, filed on Sep. 9, 2009, now Pat. No. 9,177,978.

(51) Int. Cl.
*H01L 27/13* (2006.01)
*H01L 23/66* (2006.01)

(52) U.S. Cl.
CPC ...... *H01L 27/1218* (2013.01); *H01L 27/1255* (2013.01); *H01L 27/1266* (2013.01); *H01L 27/13* (2013.01); *H01L 2223/6677* (2013.01); *H01L 2924/0002* (2013.01)

(56) References Cited

U.S. PATENT DOCUMENTS

| | | |
|---|---|---|
| 5,757,456 A | 5/1998 | Yamazaki et al. |
| 5,770,313 A | 6/1998 | Furumoto et al. |
| 5,821,138 A | 10/1998 | Yamazaki et al. |
| 6,118,502 A | 9/2000 | Yamazaki et al. |
| 6,376,333 B1 | 4/2002 | Yamazaki et al. |
| 6,491,228 B1 | 12/2002 | Ueda et al. |
| 6,762,508 B1 | 7/2004 | Kiso et al. |
| 6,869,019 B1 | 3/2005 | Nagi et al. |
| 6,982,768 B2* | 1/2006 | Ohori ............... G02F 1/136209 349/43 |
| 6,998,282 B1 | 2/2006 | Yamazaki et al. |
| 7,050,138 B1 | 5/2006 | Yamazaki et al. |
| 7,061,083 B1 | 6/2006 | Usami et al. |
| 7,361,519 B2 | 4/2008 | Yamazaki et al. |
| 7,487,373 B2 | 2/2009 | Koyama |
| 7,605,410 B2 | 10/2009 | Takano et al. |
| 7,608,531 B2 | 10/2009 | Isa et al. |
| 7,633,145 B2 | 12/2009 | Arai et al. |
| 7,710,270 B2 | 5/2010 | Shionoiri et al. |
| 7,808,098 B2 | 10/2010 | Sugiyama et al. |
| 7,851,886 B2 | 12/2010 | Dozen et al. |
| 8,010,045 B2 | 8/2011 | Kato |
| 8,039,353 B2 | 10/2011 | Dozen et al. |
| 8,222,735 B2 | 7/2012 | Shionoiri |
| 8,232,621 B2 | 7/2012 | Yamazaki et al. |
| 8,237,248 B2 | 8/2012 | Yamazaki et al. |
| 8,432,018 B2 | 4/2013 | Dozen et al. |
| 8,487,436 B2 | 7/2013 | Isa et al. |
| 8,558,370 B2 | 10/2013 | Sugiyama et al. |
| 8,642,987 B2 | 2/2014 | Takano et al. |
| 8,648,346 B2 | 2/2014 | Isa et al. |
| 8,664,035 B2 | 3/2014 | Yukawa et al. |
| 8,854,191 B2 | 10/2014 | Yamazaki et al. |
| 9,177,978 B2* | 11/2015 | Oikawa ............... H01L 27/1255 |
| 9,356,152 B2 | 5/2016 | Isa et al. |
| 10,020,296 B2* | 7/2018 | Oikawa ............... H01L 27/0248 |
| 2003/0032210 A1 | 2/2003 | Takayama et al. |
| 2003/0071953 A1 | 4/2003 | Yamazaki et al. |
| 2004/0016939 A1 | 1/2004 | Akiba et al. |
| 2004/0229404 A1 | 11/2004 | Kiso et al. |
| 2005/0070038 A1 | 3/2005 | Yamazaki et al. |
| 2005/0085034 A1 | 4/2005 | Akiba et al. |
| 2005/0162578 A1 | 7/2005 | Yamazaki et al. |
| 2006/0011288 A1 | 1/2006 | Watanabe et al. |
| 2006/0175648 A1* | 8/2006 | Asami ............... H01L 27/1255 257/296 |
| 2006/0182945 A1 | 8/2006 | Yoneyama et al. |
| 2006/0198021 A1 | 9/2006 | Fukuda et al. |
| 2006/0267771 A1 | 11/2006 | Shionoiri et al. |
| 2007/0004125 A1 | 1/2007 | Watanabe et al. |
| 2007/0044303 A1 | 3/2007 | Yamano |
| 2007/0045805 A1* | 3/2007 | Watanabe ........... H01L 27/1292 257/686 |
| 2007/0077691 A1 | 4/2007 | Watanabe |
| 2007/0105264 A1* | 5/2007 | Tsurume ............ H01L 27/1266 438/62 |
| 2007/0181875 A1 | 8/2007 | Yamazaki et al. |
| 2007/0259585 A1 | 11/2007 | Yamazaki et al. |
| 2007/0278563 A1 | 12/2007 | Takano et al. |
| 2008/0012126 A1 | 1/2008 | Dozen et al. |
| 2008/0018473 A1 | 1/2008 | Tsai et al. |
| 2008/0043177 A1 | 2/2008 | Ito |
| 2008/0044940 A1 | 2/2008 | Watanabe et al. |
| 2008/0093464 A1 | 4/2008 | Dairiki et al. |
| 2008/0224940 A1 | 9/2008 | Sugiyama et al. |
| 2008/0224941 A1 | 9/2008 | Sugiyama et al. |
| 2008/0303140 A1 | 12/2008 | Ohtani et al. |
| 2010/0065952 A1 | 3/2010 | Oikawa et al. |
| 2013/0228885 A1 | 9/2013 | Dozen et al. |

FOREIGN PATENT DOCUMENTS

| | | |
|---|---|---|
| EP | 1 826 818 A2 | 8/2007 |
| EP | 1 883 109 A1 | 1/2008 |
| EP | 1 970 952 A2 | 9/2008 |
| EP | 2 372 756 A1 | 10/2011 |
| JP | 02-043098 A | 2/1990 |
| JP | 04-112096 A | 4/1992 |
| JP | 05-201183 A | 8/1993 |
| JP | 09-286188 A | 11/1997 |
| JP | 10-303367 A | 11/1998 |
| JP | 2001-111452 A | 4/2001 |
| JP | 2002-359319 A | 12/2002 |
| JP | 2002-366918 A | 12/2002 |
| JP | 2003-124474 A | 4/2003 |
| JP | 2004-015160 A | 1/2004 |
| JP | 2005-228304 A | 8/2005 |
| JP | 2005-284352 A | 10/2005 |
| JP | 2006-302267 A | 11/2006 |
| JP | 2007-005778 A | 1/2007 |
| JP | 2007-059925 A | 3/2007 |
| JP | 2007-080130 A | 3/2007 |
| JP | 2007-096055 A | 4/2007 |
| JP | 2007-123859 A | 5/2007 |
| JP | 2007-124638 A | 5/2007 |
| JP | 2007-134694 A | 5/2007 |
| JP | 2007-193396 A | 8/2007 |
| JP | 2007-241999 A | 9/2007 |
| JP | 2007-272882 A | 10/2007 |
| JP | 2007-280372 A | 10/2007 |
| JP | 2008-053701 A | 3/2008 |
| JP | 2008-076963 A | 4/2008 |
| JP | 2008-091631 A | 4/2008 |
| JP | 2010097601 A * | 4/2010 ......... H01L 27/0248 |
| TW | 200802806 | 1/2008 |
| TW | 200814191 | 3/2008 |
| TW | 200816053 | 4/2008 |
| WO | WO 2005/069204 A1 | 7/2005 |
| WO | WO 2006/103997 A1 | 10/2006 |
| WO | WO 2007/043285 A1 | 4/2007 |
| WO | WO 2007/043602 A1 | 4/2007 |
| WO | WO 2007/105605 A1 | 9/2007 |
| WO | WO 2007/108371 A1 | 9/2007 |

OTHER PUBLICATIONS

Written Opinion re Application No. PCT/JP2009/065127, dated Dec. 1, 2009.
Definition of "polyester," American Heritage Dictionary.
Taiwanese Office Action re Application No. TW 98131226, dated Dec. 2, 2013.
Taiwanese Office Action re Application No. TW 105116108,, dated Jul. 26, 2016.

* cited by examiner

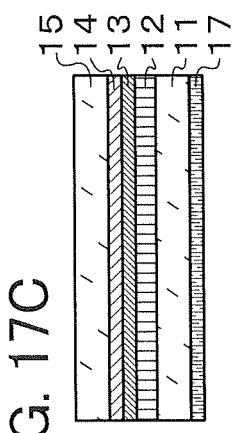
FIG. 17A
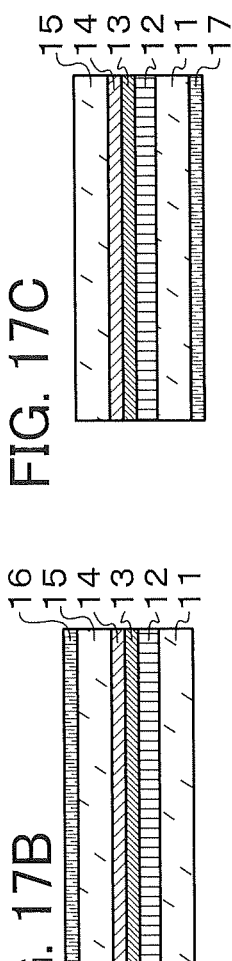
FIG. 17B
FIG. 17C
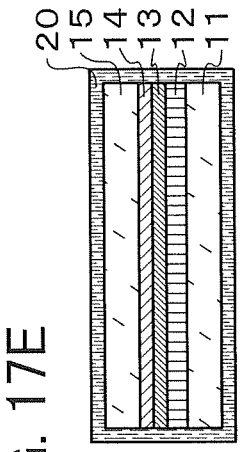
FIG. 17D
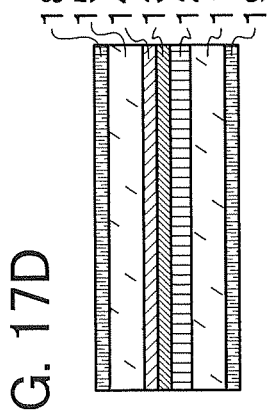
FIG. 17E
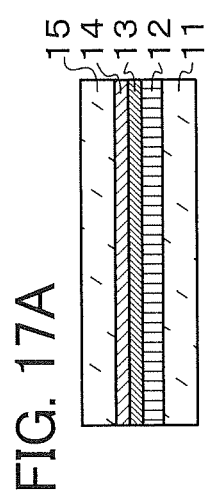
FIG. 17F
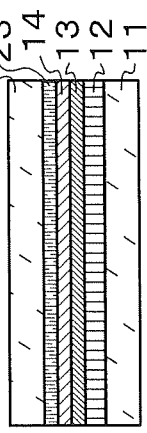
FIG. 17G
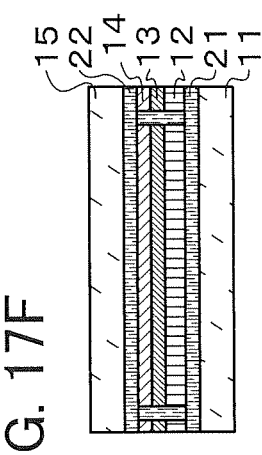

FIG.19

| | | DIFFERENCE AMONG RESPECTIVE STRUCTURES | | | | ESD MEASUREMENT RESULT (AVERAGE VALUE) | |
|---|---|---|---|---|---|---|---|
| | | MATERIAL | POSITION TO BE FORMED | CONTINUITY | FILM THICKNESS | SURFACE (ANTENNA SIDE) | REAR (THIN FILM TRANSISTOR SIDE) |
| COMPARISON STRUCTURE | FIG. 17A | × | × | × | × | 5.2kV | 2.7kV |
| FIRST STRUCTURE | FIG. 17B | Ti | FRONT SURFACE ONLY | × | 10nm | 5.8kV | 2.2kV |
| SECOND STRUCTURE | FIG. 17C | Ti | REAR SURFACE ONLY | × | 10nm | 5.2kV | 8.0kV |
| THIRD STRUCTURE | FIG. 17D | Ti | FRONT SURFACE AND REAR SURFACE | × | 10nm | 6.4kV | 8.0kV |
| | | ITO (CONTAINING SiO$_2$) | FRONT SURFACE AND REAR SURFACE OUTSIDE | × | 10nm | 9.2kV | 9.4kV |
| | | Ti | FRONT SURFACE AND REAR SURFACE | ○ | 10nm | 15.0kV OR HIGHER | 15.0kV以上 |
| FOURTH STRUCTURE | FIG. 17E | ITO (CONTAINING SiO$_2$) | FRONT SURFACE AND REAR SURFACE | ○ | 10nm | 14.0kV | 12.0kV |
| | | ITO (CONTAINING SiO$_2$) | FRONT SURFACE AND REAR SURFACE | ○ | 100nm | 15.0kV OR HIGHER | 15.0kV以上 |
| FIFTH STRUCTURE | FIG. 17F | ITSO | FRONT SURFACE AND REAR SURFACE INSIDE | ○ | 10nm | 11.0kV | 12.4kV |
| SIXTH STRUCTURE | FIG. 17G | ITSO | FRONT SURFACE ONLY | × | 10nm | 8.0kV | 2.2kV | ns is a continuation of co-pending U.S. application Ser. No. 14/929,715 filed on Nov. 2, 2015 which is a divisional of U.S. application Ser. No. 12/556,229 filed on Sept. 9, 2009 (now U.S. Pat. No. 9,177,978 issued Nov. 3, 2015).

SEMICONDUCTOR DEVICE

TECHNICAL FIELD

This application is a continuation of co-pending U.S. application Ser. No. 14/929,715 filed on Nov. 2, 2015 which is a divisional of U.S. application Ser. No. 12/556,229 filed on Sept. 9, 2009 (now U.S. Pat. No. 9,177,978 issued Nov. 3, 2015).

BACKGROUND ART

In order to realize ubiquitous computing, semiconductor devices for performing wireless communication through antennas (also referred to as RFID tags, wireless tags, IC chips, wireless chips, noncontact signal processing devices, or semiconductor integrated circuit chips) have developed (for example, see Reference 1).

REFERENCE

Reference 1: Japanese Published Patent Application No. 2007-005778

DISCLOSURE OF INVENTION

In a semiconductor device for performing wireless communication through an antenna, in order to protect the antenna and a circuit including a thin film transistor, the antenna and the circuit including the thin film transistor are interposed between epoxy resins or the like.

However, insulators such as epoxy resins easily accumulate electric charge.

Therefore, due to discharge of electric charge accumulated in an insulator, there has been a problem in that the antenna or the circuit including the thin film transistor is damaged (a problem of electrostatic discharge).

In view of the forgoing problem, the invention for solving the problem of electrostatic discharge is disclosed.

In a semiconductor device having a structure where an antenna and a circuit including a thin film transistor are interposed between a pair of insulators, at least one conductive film is formed outside or inside the pair of insulators so that electrostatic withstand voltage is increased. Thus, electrostatic discharge can be suppressed.

Note that the antenna is provided with an interlayer insulating film which covers the circuit including the thin film transistor interposed between the antenna and the circuit including the thin film transistor.

According to the results of an experiment performed by the present inventors, it is found that electrostatic discharge is generated more easily in the case where voltage is applied from a thin film transistor side as compared to the case where voltage is applied from an antenna side.

Thus, the conductive film is preferably provided on the thin film transistor side.

Further, according to the results of the experiment performed by the present inventors, it is found that electrostatic withstand voltage on the antenna side is increased by providing a conductive film on the antenna side.

Thus, the conductive film is preferably provided on the antenna side.

That is, by providing the conductive films on both the thin film transistor side and the antenna side, electrostatic withstand voltage with respect to the application of voltage on both sides is increased.

Thus, the conductive films are preferably provided on both the thin film transistor side and the antenna side.

In particular, in the case of a semiconductor device for transmitting and receiving radio waves from both surfaces regardless of a front surface and a rear surface, such as a wireless IC card used for an automatic ticket gate at a station, which has been widely used in recent years, conductive films are preferably provided on both a thin film transistor side and an antenna side.

Note that in the case where a conductive film is provided outside the pair of insulators, the conductive film is exposed.

Then, after using the semiconductor device a number of times, the exposed conductive film might be peeled due to friction or the like, so that an effect of preventing electrostatic discharge might be significantly decreased.

Thus, by providing a conductive film inside the pair of insulators, the conductive film can be protected by the pair of insulators. Needless to say, a conductive film may be provided outside the pair of insulators, or conductive films may be provided both outside and inside the pair of insulators.

Note that a problem of peeling of the conductive film due to friction or the like is a problem caused due to the film-shape of a conductor. Such a problem is not caused in the case where a conductor having sufficient thickness (e.g., a conductive substrate) is used.

Further, when a conductive film is provided on an outer side than the antenna, a problem of decrease in resonant frequency in no small part due to the conductive film is caused. When the decrease in resonant frequency is large, a problem of decrease in communication distance is caused.

Thus, by providing a conductive film between the antenna and the circuit including the thin film transistor, the antenna is exposed. Accordingly, the problem of decrease in resonant frequency due to the conductive film can be solved.

In addition, in the case where conductive films are provided on both the antenna side and the thin film transistor side, both the conductive films are electrically connected to each other. Thus, an adverse effect of electrostatic discharge due to dielectric polarization can be reduced, which is preferable.

That is, a semiconductor device which is formed as follows is preferable. A first insulator, a circuit including a thin film transistor provided over the first insulator, an antenna which is provided over the circuit and is electrically connected to the circuit, and a second insulator provided over the antenna are provided; a first conductive film is provided between the first insulator and the circuit; a second conductive film is provided between the second insulator and the antenna.

In addition, a semiconductor device which is formed as follows is preferable. A first insulator, a circuit including a thin film transistor provided over the first insulator, an antenna which is provided over the circuit and is electrically connected to the circuit, and a second insulator provided over the antenna are provided; a first conductive film is provided between the first insulator and the circuit; a second conductive film is provided between the circuit and the antenna.

Note that each of the first insulator and the second insulator preferably has a structure where a fibrous body is impregnated with an organic resin. In addition, the first conductive film and the second conductive film are preferably electrically connected to each other.

In a semiconductor device having a structure where an antenna and a circuit including a thin film transistor are interposed between a pair of insulators, at least one conductive film is formed outside or inside the pair of insulators so that electrostatic withstand voltage can be increased.

In addition, by providing a conductive film inside the pair of insulators, the conductive film can be protected by the pair of insulators. Thus, a film-shaped conductor (conductive film) can be prevented from being peeled due to friction or the like.

In addition, in the case where conductive films are provided on both an antenna side and a thin film transistor side, both the conductive films are electrically connected to each other. Thus, an adverse effect of electrostatic discharge due to dielectric polarization can be reduced.

BRIEF DESCRIPTION OF DRAWINGS

In the accompanying drawings:

FIGS. 17A to 17G illustrate comparison between structures manufactured in Example 1;
FIG. 19 illustrates measurement results in Example 1.

BEST MODE FOR CARRYING OUT THE INVENTION

Figure 1:
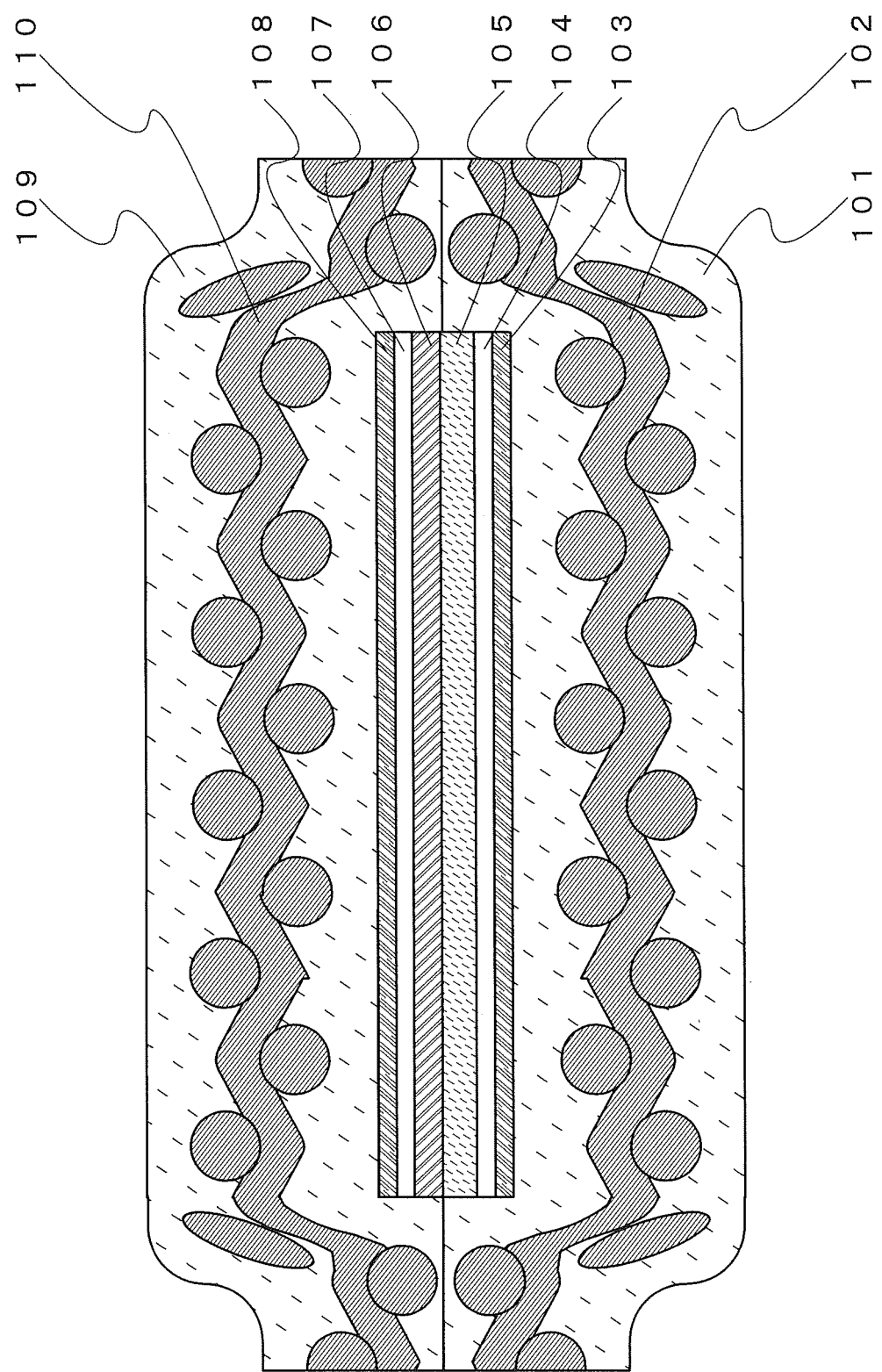
FIG. 1 illustrates an example of a semiconductor device.

Embodiments and examples will be described in detail with reference to the drawings.

Note that it will be readily appreciated by those skilled in the art that the disclosed invention is not limited to the following description and that modes and details of the disclosed invention can be changed in various ways without departing from the spirit and scope of the disclosed invention.

Therefore, the disclosed invention should not be construed as being limited to the following description of the embodiments and examples.

Note that in the structures of the invention described below, the same portions or portions having similar functions are denoted by the same reference numerals in different drawings, and description of such portions is not repeated.

Embodiment 1

In this embodiment, the structure of a semiconductor device is described.

A semiconductor device of this embodiment includes a structure where a first insulator formed using a fibrous body 102 impregnated with an organic resin 101, a first conductive film 103, a first insulating film 104, a layer 105 including a circuit having a thin film transistor, a layer 106 including an antenna, a second insulating film 107, a second conductive film 108, and a second insulator formed using a fibrous body 110 impregnated with an organic resin 109 are sequentially stacked (see FIG. 1).

Note that the antenna is electrically connected to the circuit having the thin film transistor with an interlayer insulating film interposed therebetween.

As each of the organic resin 101 and the organic resin 109, a thermosetting resin, a thermoplastic resin, or the like can be used.

As a thermosetting resin, an epoxy resin, an unsaturated polyester resin, a polyimide resin, a bismaleimide triazine resin, a cyanate resin, or the like can be used.

As a thermoplastic resin, a polyphenylene oxide resin, a polyetherimide resin, a fluoropolymer, or the like can be used.

By using a thermosetting resin or a thermoplastic resin, thermocompression bonding is possible. Thus, manufacturing steps can be simplified, which is advantageous.

In addition, each of the fibrous body 102 and the fibrous body 110 is a woven fabric or a nonwoven fabric.

A woven fabric is a cloth-shaped material obtained by weaving a plurality of fibers.

A nonwoven fabric is a cloth-shaped material obtained by performing fusion bonding, adhesive bonding, twisting, or the like on a plurality of fibers without weaving the plurality of fibers.

As a fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, or the like can be used.

As a glass fiber, a glass fiber or the like formed using E glass, S glass, D glass, Q glass, or the like can be used.

Note that the fibrous body may be formed using only one kind of the materials of the plurality of fibers, or may be formed using plural kinds of the materials of the plurality of fibers.

Figure 16:
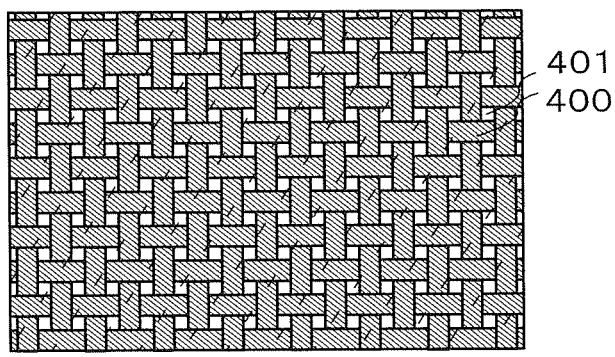
FIG. 16 is a top view of a prepreg.

The first insulator and the second insulator have a structure where a fibrous body 400 (corresponding to the fibrous body 102 and the fibrous body 110) is impregnated with an organic resin 401 (corresponding to the organic resin 101 and the organic resin 109) (see FIG. 16).

An insulator formed using a fibrous body impregnated with an organic resin is also referred to as a prepreg.

Typically, a prepreg is formed as follows: after a fibrous body is impregnated with a varnish in which a matrix resin is diluted with an organic solvent, drying is performed so that the organic solvent is volatilized and the matrix resin is semi-cured.

When the thickness of the prepreg is greater than or equal to 10 μm and less than or equal to 100 μm, a thin flexible semiconductor device can be manufactured, which is preferable.

Note that each of the first insulator and the second insulator may be formed using only an organic resin which does not include a fibrous body.

As the organic resin in this case, an epoxy resin, an unsaturated polyester resin, a polyimide resin, a bismaleimide triazine resin, a cyanate resin, a polyphenylene oxide resin, a polyetherimide resin, a fluoropolymer, or the like can be used.

Note that since the prepreg includes the fibrous body, the prepreg has high pulling and bending durability and a function of diffusing local pressure.

Thus, the prepreg including the fibrous body is preferably used for each of the first insulator and the second insulator.

Further, when the first conductive film 103 and the second conductive film 108 are provided, static electricity locally accumulated in the first insulator and the second insulator can be diffused. Therefore, a large amount of static electricity can be prevented from being locally accumulated and discharged.

For the first conductive film 103 and the second conductive film 108, titanium, molybdenum, tungsten, aluminum, titanium nitride, tantalum nitride, tungsten nitride, indium oxide, indium tin oxide containing silicon oxide, or the like can be used. Note that the material for the first conductive film 103 and the second conductive film 108 is not limited to the above material, and any conductive material can be used as long as it has an effect of increasing electrostatic withstand voltage. Note that by forming conductive films having slits, such as a plurality of island-shaped conductive films or mesh conductive films, electromagnetic waves are easily transmitted through the slits, which is preferable. In addition, in the case where conductive films are provided on both sides, one of the conductive films is preferably formed as a light-transmitting conductive film (formed using indium oxide, indium tin oxide containing silicon oxide, or the like) and the other of the conductive films is preferably formed as a light-blocking conductive film (formed using titanium, molybdenum, tungsten, aluminum, or the like) because the difference between a front surface and a rear surface is easily understood. The reason for understanding the difference between the front surface and the rear surface is that reading of signals is easily performed in the case where the signals are input from a front surface side on which the antenna is provided when the signals are input to the semiconductor device.

In the layer 105 including the circuit having the thin film transistor, the thin film transistor may have any structure as long as it functions as a switching element. For example, either a top-gate thin film transistor or a bottom-gate thin film transistor may be used.

Note that instead of the thin film transistor, a switching element such as an MIM element may be used because only the function as a switching element is necessary. Alternatively, a switching element formed using a silicon wafer may be used.

The first insulating film 104 is a base insulating film which is provided below the layer 105 including the circuit having the thin film transistor.

By providing the base insulating film between the first conductive film 103 and the layer 105 including the circuit having the thin film transistor, the circuit can be prevented from being short-circuited due to electrical connection between the thin film transistors by the first conductive film 103.

As the first insulating film 104 (the base insulating film), a silicon oxide film, a silicon nitride film, an organic resin film, or the like can be used.

For the antenna of the layer 106 including the antenna, titanium, molybdenum, tungsten, aluminum, copper, silver, gold, nickel, platinum, palladium, iridium, rhodium, tantalum, cadmium, zinc, iron, or the like can be used.

The shape of the antenna may be a linear shape, a curved shape, a meandering shape, a coiled shape, a ribbon shape, a shape in which these shapes are combined with each other, or the like can be used.

Note that an antenna for electromagnetic induction, which includes two kinds of antennas, may be used.

For example, a first antenna which is electrically connected to the circuit has a coiled shape, and a second antenna is provided over the first antenna with an insulating film interposed therebetween. As the insulating film, a silicon oxide film, a silicon nitride film, an organic resin film, or the like can be used.

As the shape of the second antenna, at least a first region having a coiled shape and a second region having a linear shape, a curved shape, a meandering shape, a ribbon shape, a shape in which these shapes are combined with each other, or the like are provided.

Since the first region is provided in a position overlapping with the first antenna, signals received in the second region are supplied to the first antenna by electromagnetic induction.

A method by which signals are transmitted by using two kinds of antennas by electromagnetic induction in this manner is referred to as an electromagnetic induction method.

In addition, the second insulating film 107 is a protective film of the antenna.

With the protective film, the antenna can be protected when the prepreg or the like is thermally compressed.

By providing the second insulating film 107 between the second conductive film 108 and the layer 106 including the antenna, the second conductive film 108 and the antenna can be prevented from being short-circuited.

As the second insulating film 107, a silicon oxide film, a silicon nitride film, an organic resin film, or the like can be used.

Note that each of the first conductive film 103, the first insulating film 104, the antenna, the second insulating film 107, and the second conductive film 108 may have either a single-layer structure or a layered structure.

Further, by providing a buffer including aramid or the like on a single surface or both surfaces of each of the first insulator and the second insulator, resistance against pressure can be improved, which is preferable.

In particular, by providing buffers outside the first insulator and the second insulator, pressure from the outside can be directly relieved, which is preferable.

By providing the first conductive film 103 and the second conductive film 108 as described above, electrostatic withstand voltage can be increased.

In particular, in the case where the fibrous body is used, resistance against physical force such as pressure and stress and resistance against electrical force such as static electricity can be improved simultaneously by providing at least one film-shaped conductor (the first conductive film 103, the second conductive film 108, or the like).

Since the structure where at least one film-shaped conductor is provided is extremely simple, the structure can be applied to any insulator.

Thus, the application range of the structure is extremely wide.

Note that as a transformed example, a method by which a plurality of conductive particles are contained in an organic resin used for a prepreg (a method by which conductivity is imparted inside a prepreg) can be used.

Note that since it is nearly impossible to electrically connect all fibers that are twisted intricately to each other with the plurality of conductive particles, it might be difficult to prevent static electricity from being locally accumulated.

Further, since the particles and the organic resin are mixed with each other, an insulating portion inevitably remains. Thus, static electricity might be locally accumulated in the insulating portion.

Therefore, in the structure where at least one film-shaped conductor is provided, static electricity can be more surely prevented from being accumulated, which is preferable.

This is because the film-shaped conductor is provided so as to cover the entire surface, so that an effect of preventing static electricity from being accumulated locally is high.

This embodiment can be combined with all the other embodiments.

Embodiment 2

In this embodiment, a transformed example of Embodiment 1 is described.

Figure 2:
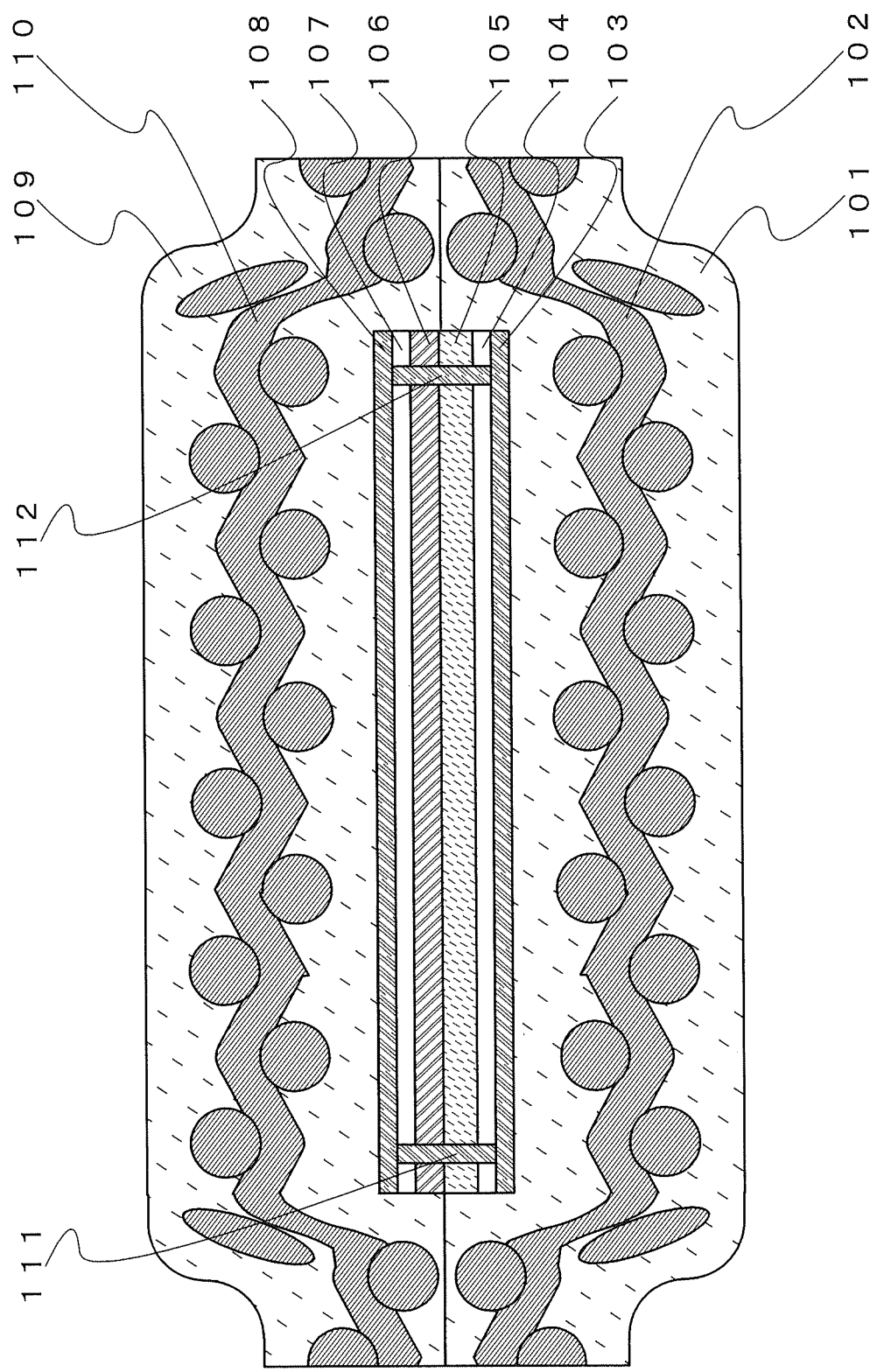
FIG. 2 illustrates an example of a semiconductor device.

As in Embodiment 1, a semiconductor device of this embodiment includes a structure where the first insulator formed using the fibrous body 102 impregnated with the organic resin 101, the first conductive film 103, the first insulating film 104, the layer 105 including the circuit having the thin film transistor, the layer 106 including the antenna, the second insulating film 107, the second conductive film 108, and the second insulator formed using the fibrous body 110 impregnated with the organic resin 109 are sequentially stacked (see FIG. 2).

The structure of this embodiment differs from the structure of Embodiment 1 in that a conductor 111 and a conductor 112 for bringing the first conductive film 103 and the second conductive film 108 into conduction are provided (see FIG. 2).

Although the two conductors 111 and 112 are provided in this embodiment, the number of conductors may be one or three or more as long as the first conductive film 103 and the second conductive film 108 can be brought into conduction.

By providing a conductor for bringing the first conductive film 103 and the second conductive film 108 into conduction, a potential of the first conductive film 103 and a potential of the second conductive film 108 are kept at the same level.

Then, current can be prevented from flowing through a path interposed between the first conductive film 103 and the second conductive film 108.

Accordingly, the circuit can be prevented from being damaged by current in a direction perpendicular to the circuit.

This embodiment can be combined with all the other embodiments.

Embodiment 3

In this embodiment, a transformed example of Embodiment 1 or 2 is described.

Any structure has an effect of increasing electrostatic withstand voltage as long as it includes at least one film-shaped conductor. Thus, structures illustrated in FIGS. 3A to 3F can be used.

In FIGS. 3A to 3F, a first insulator 201, a layer 202 including a circuit over a base insulating film, a layer 203 including an antenna, a protective film 204, and a second insulator 205 are sequentially stacked.

In addition, positions where conductive films 206 to 212 are formed are different in FIGS. 3A to 3F.

Note that as materials of the first insulator 201, the base insulating film, the circuit, the antenna, the protective film 204, and the second insulator 205, the materials of the first insulator, the base insulating film, the circuit, the antenna, the protective film, and the second insulator which are described in Embodiment 1 can be used.

Figure 3B:
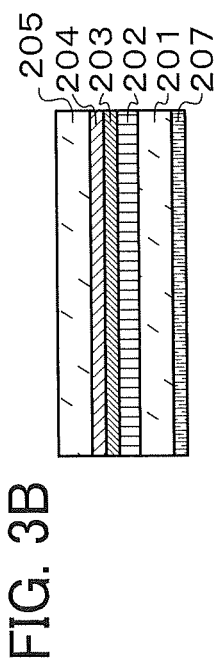
FIGS. 3A to 3F illustrate examples of semiconductor devices.
Figure 3D:
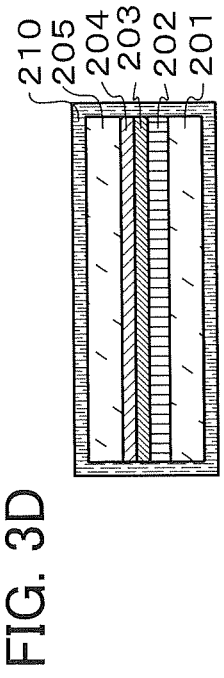
Figure 3F:
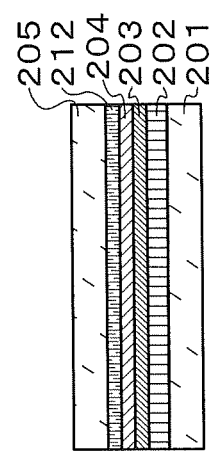
Figure 3A:
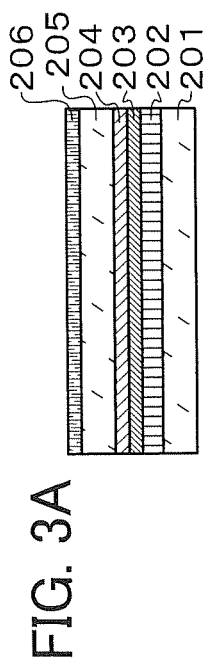

In FIG. 3A, the conductive film 206 is formed outside the first insulator 201 and the second insulator 205 and is formed on an antenna side.

In FIG. 3B, the conductive film 207 is formed outside the first insulator 201 and the second insulator 205 and is formed on a thin film transistor side.

Figure 3C:
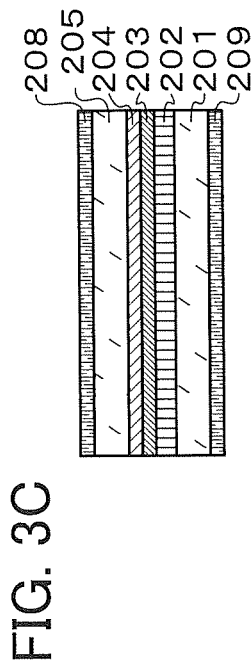

In FIG. 3C, the conductive film 208 is formed outside the first insulator 201 and the second insulator 205 and is formed on an antenna side, and the conductive film 209 is formed outside the first insulator 201 and the second insulator 205 and is formed on a thin film transistor side. Note that the conductive film 208 and the conductive film 209 are not electrically connected to each other.

In FIG. 3D, whole external surfaces of the first insulator 201 and the second insulator 205 are surrounded by the conductive film 210.

Figure 3E:
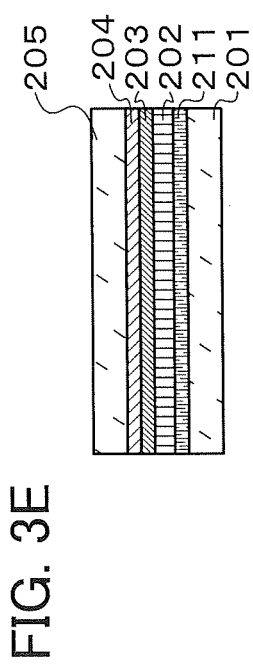

In FIG. 3E, the conductive film 211 is formed inside the first insulator 201 and the second insulator 205 and is formed on an antenna side.

In FIG. 3F, the conductive film 212 is formed inside the first insulator 201 and the second insulator 205 and is formed on a thin film transistor side.

This embodiment can be combined with all the other embodiments.

Embodiment 4

In this embodiment, an example of a method for manufacturing the semiconductor devices described in Embodiments 1 to 3 is described.

Figure 4A:
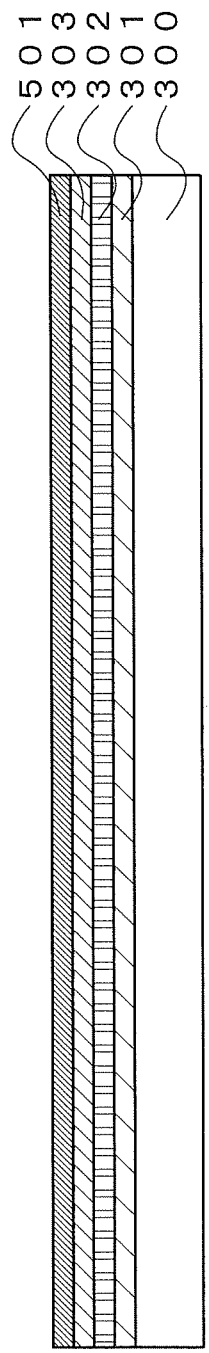
FIGS. 4A and 4B illustrate an example of a method for manufacturing a semiconductor device.

First, over a substrate 300 (a base substrate or a substrate for manufacture of a circuit), an insulating film 301, a metal film 302, an insulating film 303, and a first conductive film 501 are sequentially formed (see FIG. 4A).

As the substrate 300 (the base substrate or the substrate for manufacture of the circuit), a glass substrate, a quartz substrate, a metal substrate, a plastic substrate, or the like can be used.

As the insulating film 301, a silicon oxide film, a silicon nitride film, a silicon oxide film containing nitrogen, a silicon nitride film containing oxygen, an aluminum nitride film, an aluminum oxide film, or the like can be used. The insulating film 301 can be formed by CVD, sputtering, or the like. The thickness of the insulating film 301 is preferably 10 to 500 nm. Note that the formation of the insulating film 301 may be omitted.

As the metal film 302, a tungsten film, a molybdenum film, a titanium film, a tantalum film, or the like can be used. The metal film 302 can be formed by CVD, sputtering, or the like. The thickness of the metal film 302 is preferably 100 to 1000 nm.

As the insulating film 303, a silicon oxide film, a silicon nitride film, or the like can be used. The insulating film 303 can be formed by CVD, sputtering, or the like. The thickness of the insulating film 303 is preferably 10 to 100 nm.

The first conductive film 501 is a conductive film for countermeasures against electrostatic discharge. For the first conductive film 501, titanium, molybdenum, tungsten, aluminum, titanium nitride, tantalum nitride, tungsten nitride, indium oxide, indium tin oxide containing silicon oxide, or the like can be used. Note that the material for the first conductive film 501 is not limited to the above material, and any conductive material can be used as long as it has an effect of increasing electrostatic withstand voltage. The first conductive film 501 can be formed by CVD, evaporation, sputtering, or the like. The thickness of the first conductive film 501 is preferably 5 to 200 nm (or 10 to 100 nm). Note that by forming conductive films having slits, such as a plurality of island-shaped conductive films or mesh conductive films, electromagnetic waves are easily transmitted through the slits, which is preferable.

Note that in order to effectively prevent the semiconductor device from being damaged by static electricity, the sheet resistance of the first conductive film 501 is lower than or equal to $1.0 \times 10^7$ ohms/square, preferably lower than or equal to $1.0 \times 10^4$ ohms/square, more preferably lower than or equal to $1.0 \times 10^2$ ohms/square.

Here, by sputtering a silicon target with an argon gas containing oxygen, the insulating film 303 containing silicon oxide can be formed.

In this case, a surface of the metal film 302 is oxidized with oxygen so that a separation layer is formed. Thus, separation can be performed by physical force in a later separation step.

Note that by sputtering the silicon target with an argon gas containing nitrogen, a surface of the metal film 302 may be nitrided so that a separation layer is formed and the insulating film 303 may be formed using a silicon nitride film.

Alternatively, a separation layer may be formed by performing oxygen plasma treatment or nitrogen plasma treatment on a surface of the metal film 302 before the insulating film 303 is formed.

In the case where oxygen plasma treatment or nitrogen plasma treatment is performed on the surface of the metal film 302, a structure may be used in which the first conductive film 501 is formed over the metal film 302 without the formation of the insulating film 303.

Alternatively, instead of forming the metal film 302, a separation layer formed using silicon may be formed between the insulating film 301 and the insulating film 303.

In the case where the separation layer formed using silicon is used, by using halogen fluoride (e.g., chlorine fluoride (ClF), chlorine trifluoride (ClF$_3$), bromine fluoride (BrF), bromine trifluoride (BrF$_3$), iodine fluoride (IF), or iodine trifluoride (IF$_3$)) in the later separation step, silicon is etched, so that separation can be performed.

Note that since halogen fluoride has an operation of etching silicon, metal (e.g., aluminum), or the like, the insulating film 303 has an effect of protecting the first conductive film 501 in the case where silicon is used for the separation layer.

Thus, a structure may be used in which metal (e.g., aluminum) is used for the separation layer instead of silicon and halogen fluoride is used as an etching material of the separation layer.

Note that in the case where a material which is not etched by halogen fluoride (e.g., an oxide conductor (indium tin oxide, indium oxide containing silicon oxide, or zinc oxide)) is used for the first conductive film, the insulating film 303 is not necessarily provided.

By using a structure in which a separation layer is provided between at least the substrate 300 and the first conductive film 501 as described above, the substrate 300 can be separated from the first conductive film 501, a circuit provided over the first conductive film, and the like in the later separation step.

Figure 4B:
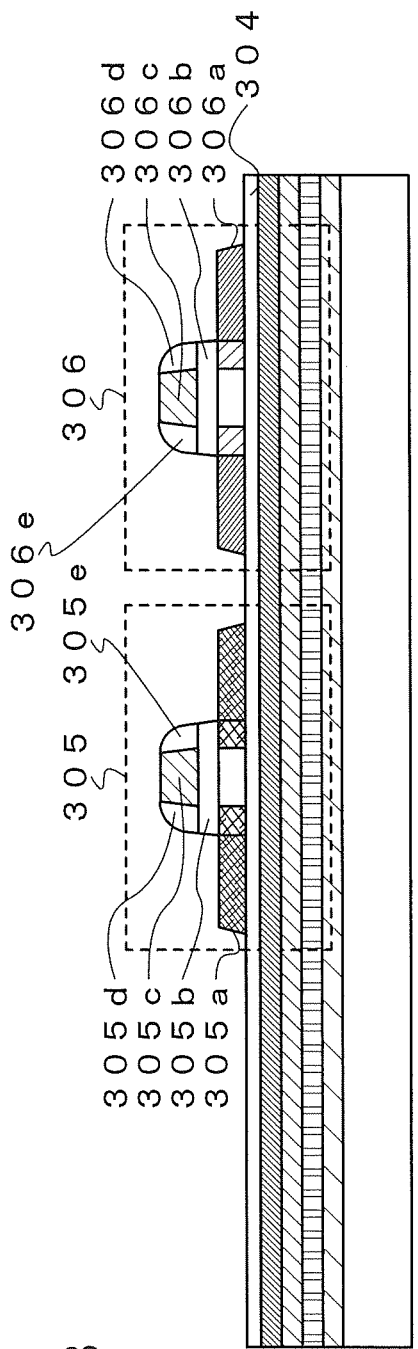

Next, a first insulating film 304 (a base insulating film) is formed, and a thin film transistor 305 and a thin film transistor 306 are formed over the first insulating film 304 (see FIG. 4B).

The thin film transistor 305 includes a semiconductor layer 305a, a gate insulating film 305b which is formed over the semiconductor layer 305a, a gate electrode 305c which is formed over the gate insulating film 305b, and a sidewall 305d and a sidewall 305e which are formed over the gate insulating film 305b and formed in contact with sidewalls of the gate electrode 305c (see FIG. 4B).

The thin film transistor 306 includes a semiconductor layer 306a, a gate insulating film 306b which is formed over the semiconductor layer 306a, a gate electrode 306c which is formed over the gate insulating film 306b, and a sidewall 306d and a sidewall 306e which are formed over the gate insulating film 306b and formed in contact with sidewalls of the gate electrode 306c (see FIG. 4B).

Note that a plurality of thin film transistors are formed in the circuit only as needed.

In addition, although the top-gate thin film transistors are illustrated in this embodiment, bottom-gate thin film transistors can be used.

Further, although the thin film transistors having LDD structures are illustrated, the thin film transistors do not necessarily have the LDD structures.

Furthermore, instead of the thin film transistors, MIM elements or the like may be used because only the functions as switching elements are necessary.

Note that for the semiconductor layers of the thin film transistors, silicon, silicon germanium, an oxide semiconductor, an organic semiconductor, or the like can be used.

In addition, for the gate insulating films and the sidewalls of the thin film transistors, silicon oxide, silicon nitride, or the like can be used.

Further, for the gate electrodes of the thin film transistors, tungsten, molybdenum, aluminum, titanium, silicon, or the like can be used.

Figure 5A:
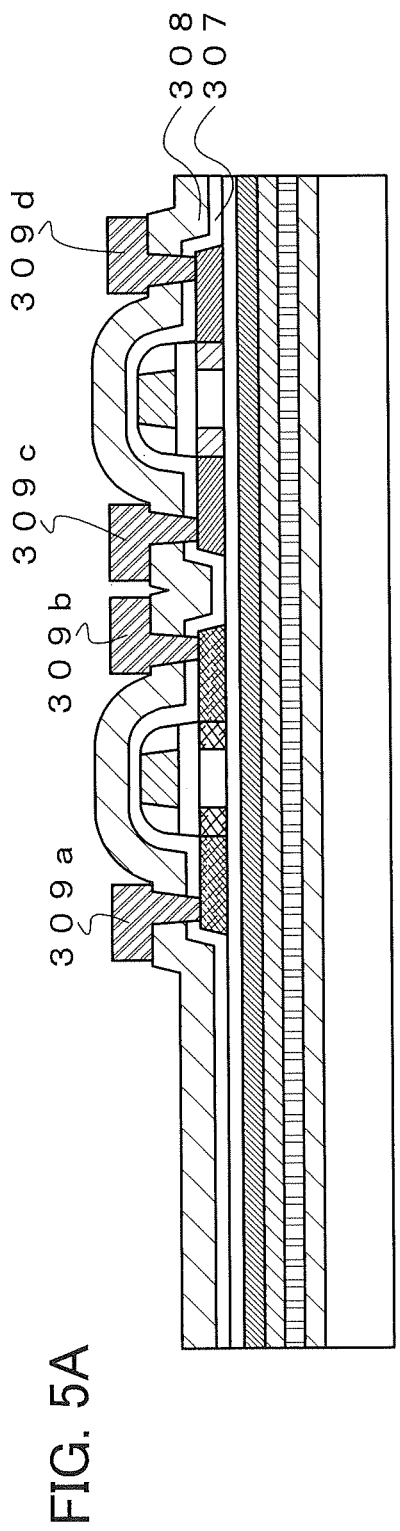
FIGS. 5A and 5B illustrate an example of the method for manufacturing a semiconductor device.

Next, a first interlayer insulating film 307 which covers the thin film transistor 305 and the thin film transistor 306 is formed; a second interlayer insulating film 308 is formed over the first interlayer insulating film 307; contact holes which reach the thin film transistor 305 and the thin film transistor 306 are formed in the first interlayer insulating film 307 and the second interlayer insulating film 308; wirings 309a to 309d which are electrically connected to the thin film transistor 305 and the thin film transistor 306 are formed over the second interlayer insulating film 308 (see FIG. 5A).

By electrically connecting the thin film transistors with the wirings, the circuit is formed.

As the first interlayer insulating film 307, a silicon oxide film, a silicon nitride film, an organic resin film, or the like can be used. The thickness of the first interlayer insulating film 307 is preferably 50 to 200 nm.

As the second interlayer insulating film 308, a silicon oxide film, a silicon nitride film, an organic resin film, or the like can be used. The thickness of the second interlayer insulating film 308 is preferably 300 to 5000 nm.

Note that although two interlayer insulating films are used as the interlayer insulating films in this embodiment, a single interlayer insulating film may be used or three or more interlayer insulating films may be used.

For the wirings 309a to 309d, aluminum, titanium, molybdenum, tungsten, gold, silver, copper, or the like can be used. The thickness of each of the wirings 309a to 309d is preferably 1000 to 5000 nm. Note that each of the wirings 309a to 309d may have either a single-layer structure or a layered structure.

Figure 5B:
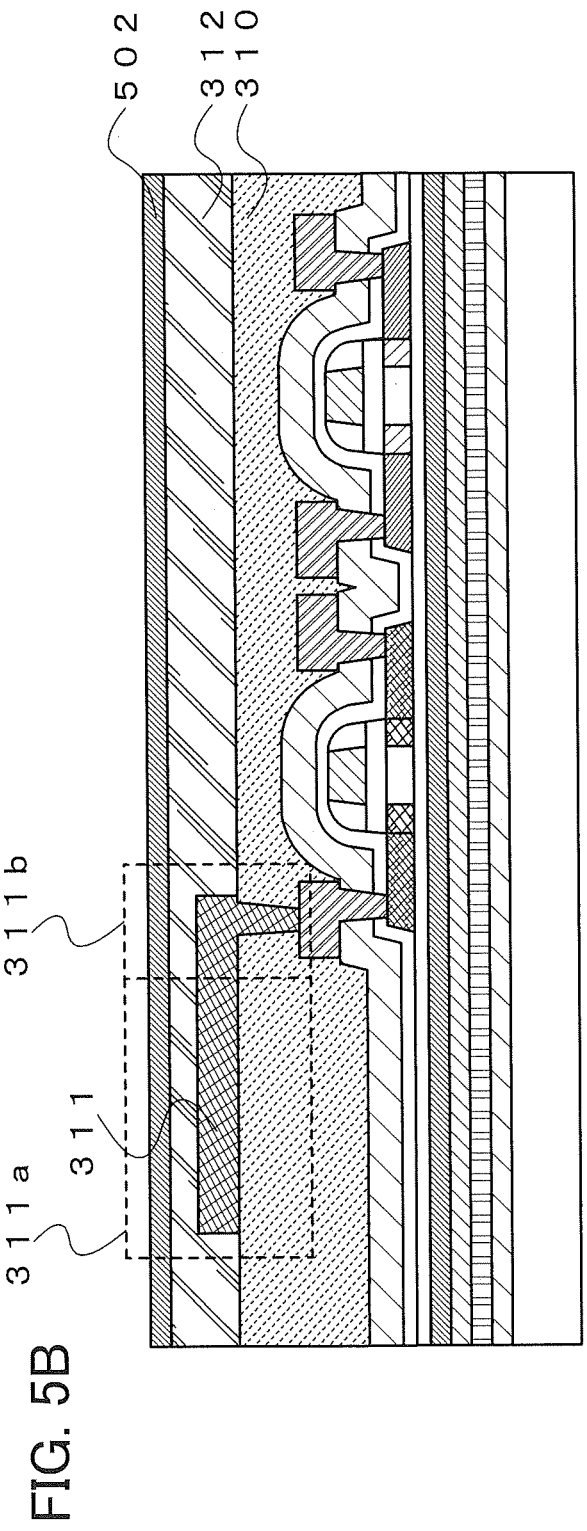

Next, a third interlayer insulating film 310 which covers the wirings 309a to 309d is formed; a contact hole which reaches the wiring 309a is formed in the third interlayer insulating film 310; a layer 311 including an antenna is formed over the third interlayer insulating film 310; a second insulating film 312 (a protective film) is formed over the layer 311 including the antenna; a second conductive film 502 is formed over the second insulating film 312 (the protective film) (see FIG. 5B).

As the third interlayer insulating film 310, a silicon oxide film, a silicon nitride film, an organic resin film, or the like can be used. The thickness of the third interlayer insulating film 310 is preferably 300 to 5000 nm.

For the layer 311 including the antenna, aluminum, titanium, molybdenum, tungsten, gold, silver, copper, or the like can be used. The thickness of the layer 311 including the antenna is preferably 1000 to 5000 nm. Note that the layer 311 including the antenna may have either a single-layer structure or a layered structure.

Note that the layer 311 including the antenna has an antenna 311a and a wiring portion 311b.

As the second insulating film 312 (the protective film), a silicon oxide film, a silicon nitride film, or the like can be used. The thickness of the second insulating film 312 (the protective film) is preferably 100 to 1000 nm.

The second insulating film 312 (the protective film) protects the antenna when a prepreg or the like is thermally compressed. In addition, the second insulating film 312 (the protective film) can prevent the second conductive film 502 and the layer 311 including the antenna from being short-circuited.

Note that the second conductive film 502 and the layer 311 including the antenna are not electrically connected to each other.

The second conductive film 502 is a conductive film for countermeasures against electrostatic discharge. For the second conductive film 502, titanium, molybdenum, tungsten, aluminum, titanium nitride, tantalum nitride, tungsten nitride, indium oxide, indium tin oxide containing silicon oxide, or the like can be used. Note that the material for the second conductive film 502 is not limited to the above material, and any conductive material can be used as long as it has an effect of increasing electrostatic withstand voltage. The second conductive film 502 can be formed by CVD, evaporation, sputtering, or the like. The thickness of the second conductive film 502 is preferably 5 to 200 nm (or 10 to 100 nm). Note that by forming conductive films having slits, such as a plurality of island-shaped conductive films or mesh conductive films, electromagnetic waves are easily transmitted through the slits, which is preferable.

Note that in order to effectively prevent the semiconductor device from being damaged by static electricity, the sheet resistance of the second conductive film 502 is lower than or equal to $1.0 \times 10^7$ ohms/square, preferably lower than or equal to $1.0 \times 10^4$ ohms/square, more preferably lower than or equal to $1.0 \times 10^2$ ohms/square.

Figure 6:
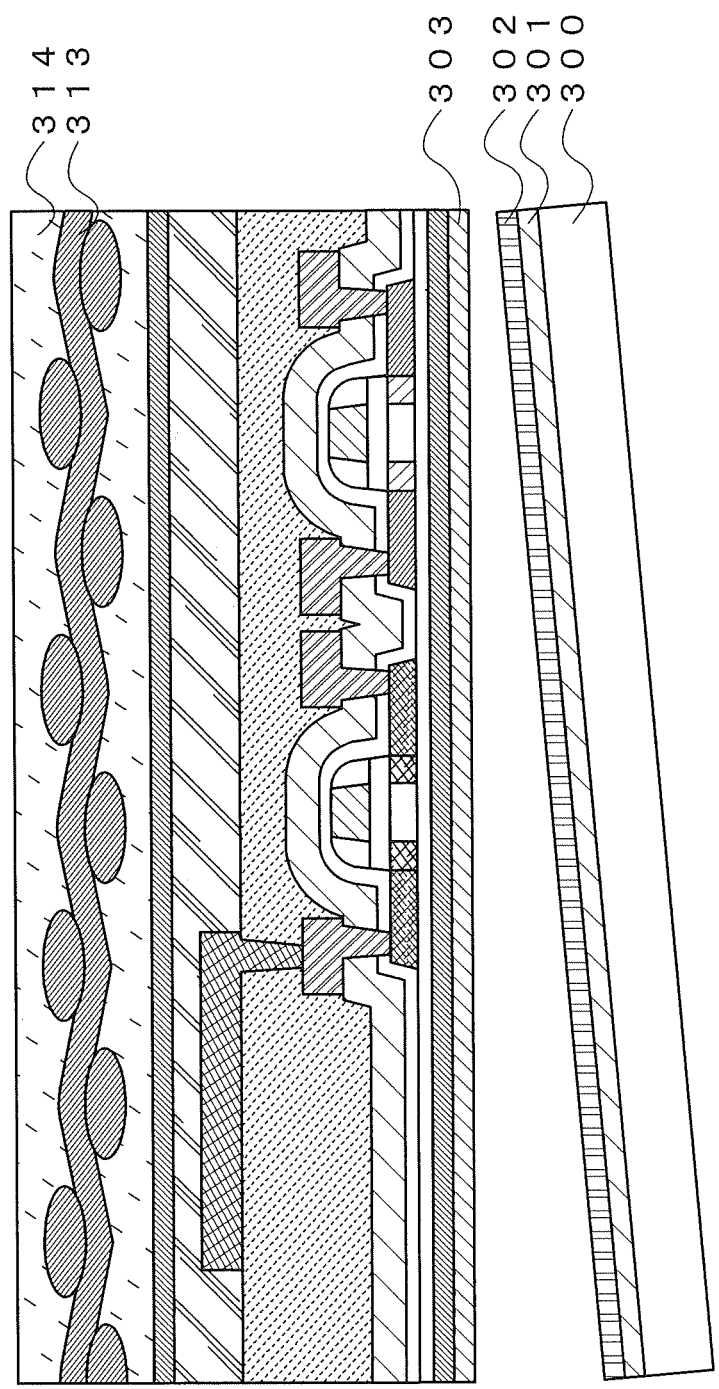
FIG. 6 illustrates an example of the method for manufacturing a semiconductor device.

Next, a first insulator in which a fibrous body 313 is impregnated with an organic resin 314 is thermally compressed over the second conductive film 502. Then, after the thermal compression, by application of physical force (pulling, pushing, or the like), a separation step of separating the substrate 300, the insulating film 301, and the metal film 302 is performed (see FIG. 6).

Since the surface of the metal film 302 is oxidized or nitrided, adhesion between the metal film 302 and the insulating film 303 is weak.

Thus, by the application of physical force, the substrate 300, the insulating film 301, and the metal film 302 are selectively separated.

The substrate 300, the insulating film 301, and the metal film 302 may be selectively separated by introduction of water from side surfaces.

Since water enters a separation interface by the introduction of water, a circuit side and a substrate side are electrically connected to each other with water.

Although static electricity is generated in separation, a problem of electrostatic discharge in the separation is more likely to be prevented when the circuit side and the substrate side are electrically connected to each other with water.

Note that in order to improve the conductivity of water, an aqueous solution such as a saline solution or carbonated water may be used. Note that since salt adversely affects the circuit, carbonated water is preferable.

Note that in the case where a separation layer formed using silicon is formed instead of the metal film 302, the separation layer formed using silicon is selectively etched by halogen fluoride, so that the substrate 300 and the insulating film 301 are selectively separated.

A step of selectively separating at least the substrate 300 by using a separation layer is referred to as a separation step. In addition, a circuit from which a substrate is selectively separated in a separation step is referred to as a separation circuit. Alternatively, such a circuit may be referred to as a peel circuit because only a thin circuit like skin remains after a substrate is separated. Note that the peel circuit may be formed by a different method such as a method for forming a peel circuit by removing a substrate with an etchant or a method for forming a peel circuit by forming a circuit over a flexible substrate.

A separation circuit (a peel circuit) including a thin film transistor is extremely thin. Thus, the circuit is extremely weak in pulling, pressure from the outside, or the like.

On the other hand, as for an insulator in which a fibrous body is impregnated with an organic resin, the insulator has the fibrous body, so that it has high resistance against pulling and can diffuse pressure from the outside.

Therefore, by interposing the separation circuit (the peel circuit) including the thin film transistor between insulators in which fibrous bodies are impregnated with an organic resin, the separation circuit (the peel circuit) including the thin film transistor can be protected against pulling and pressure from the outside.

Figure 7:
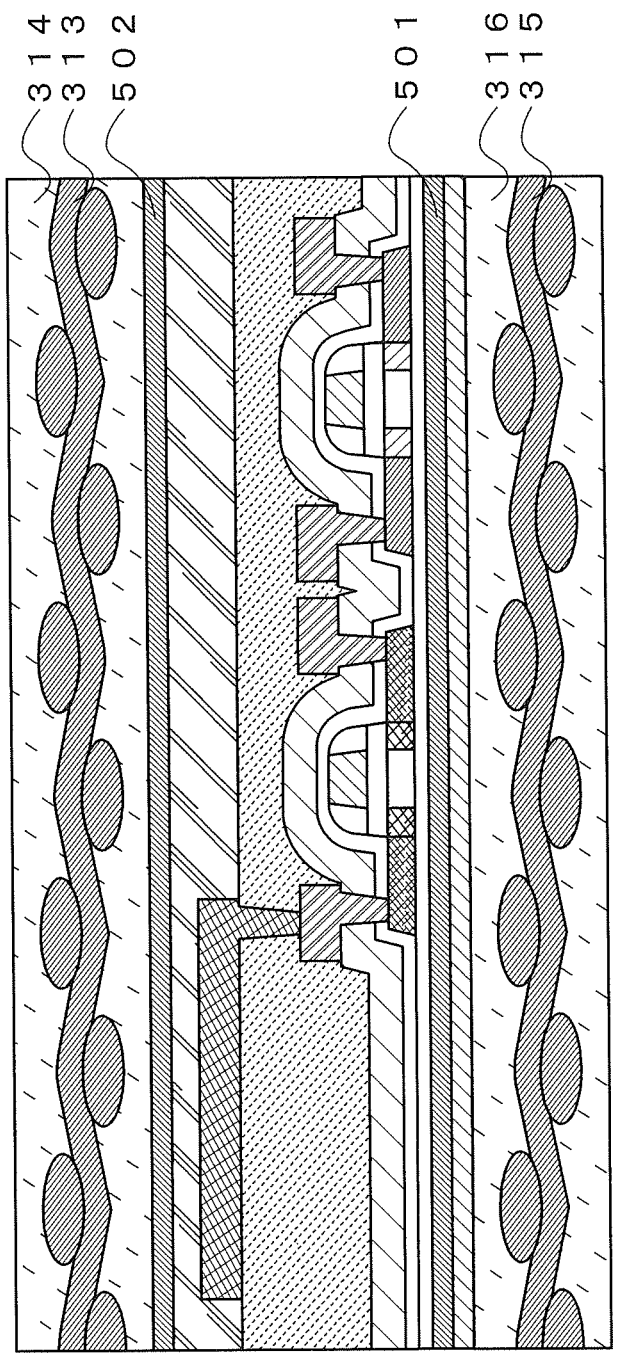
FIG. 7 illustrates an example of the method for manufacturing a semiconductor device.

Then, after the separation step, a second insulator in which a fibrous body 315 is impregnated with an organic resin 316 is thermally compressed below the insulating film 303 (see FIG. 7).

Note that although the prepreg illustrated in Embodiment 1 is used for the first insulator and the second insulator, an insulator which does not include a fibrous body may be used in the case where the separation circuit (the peel circuit) is not used or in the case where resistance against pulling, pressure from the outside, and the like is not considered.

Note that by using a prepreg in the case where the separation circuit (the peel circuit) is used, a flexible semiconductor device which has resistance against pulling, pressure from the outside, and the like can be used, which is preferable.

In addition; by providing the first conductive film 501 and the second conductive film 502, a semiconductor device which has high electrostatic withstand voltage can be provided.

In particular, in the case where a prepreg having a complicated shape like a fibrous body is used, electrostatic withstand voltage is further increased in the case where a film-like conductor is provided as in this embodiment as compared to the case where conductive particles are used inside the prepreg.

Further, since it is necessary to form only a film in manufacturing steps, the manufacturing steps can be simplified, which is preferable.

This embodiment can be combined with all the other embodiments.

Embodiment 5

In this embodiment, a transformed example of Embodiment 4 is described.

Figure 8A:
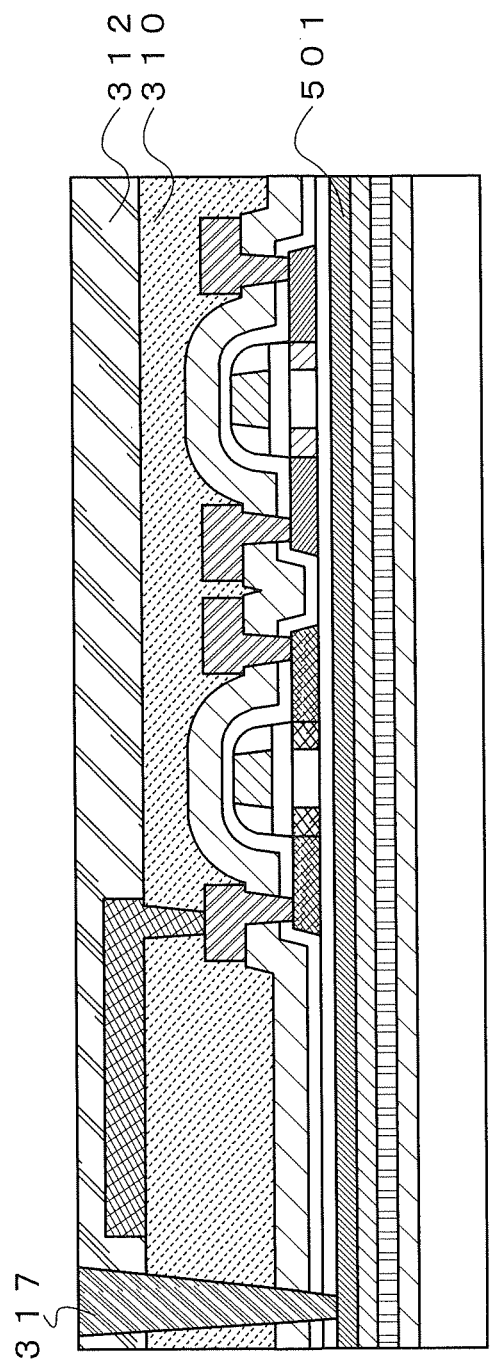
FIGS. 8A and 8B illustrate an example of a method for manufacturing a semiconductor device.

After the step of FIG. 5A, the third interlayer insulating film 310 which covers the wirings 309a to 309d is formed; the contact hole which reaches the wiring 309a is formed in the third interlayer insulating film 310; the layer 311 including the antenna is formed over the third interlayer insulating film 310; the second insulating film 312 (the protective film) is formed over the layer 311 including the antenna; a contact hole which reaches the first conductive film 501 is formed in a position where the layer 311 including the antenna and the thin film transistor are not formed; a conductor 317 is embedded in the contact hole (see FIG. 8A).

For the conductor 317, aluminum, titanium, molybdenum, tungsten, gold, silver, copper, or the like can be used. As an embedding method, a method can be used by which after a conductive film is formed to a thickness which is larger than the depth of the contact hole, etching is performed by etch back, chemical mechanical polishing (CMP), or the like so that a surface of the protective film is exposed.

Figure 8B:
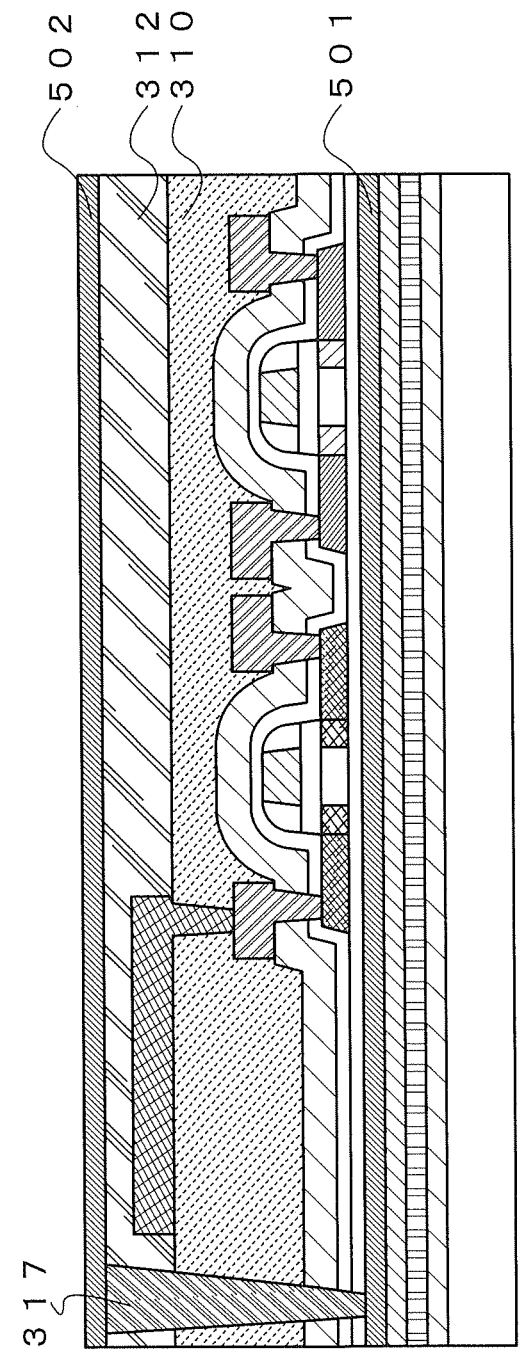

Note that although the number of portions where the first conductive film 501 and the second conductive film 502 are in contact with each other is only one in FIGS. 8A and 8B, the number of portions where the first conductive film 501 and the second conductive film 502 are in contact with each other may be plural.

Note that the portions where the first conductive film 501 and the second conductive film 502 are in contact with each other are located in the position where the layer 311 including the antenna and the thin film transistor are not formed.

Next, the second conductive film 502 which is electrically connected to the conductor 317 is formed over the second insulating film 312.

Figure 9:
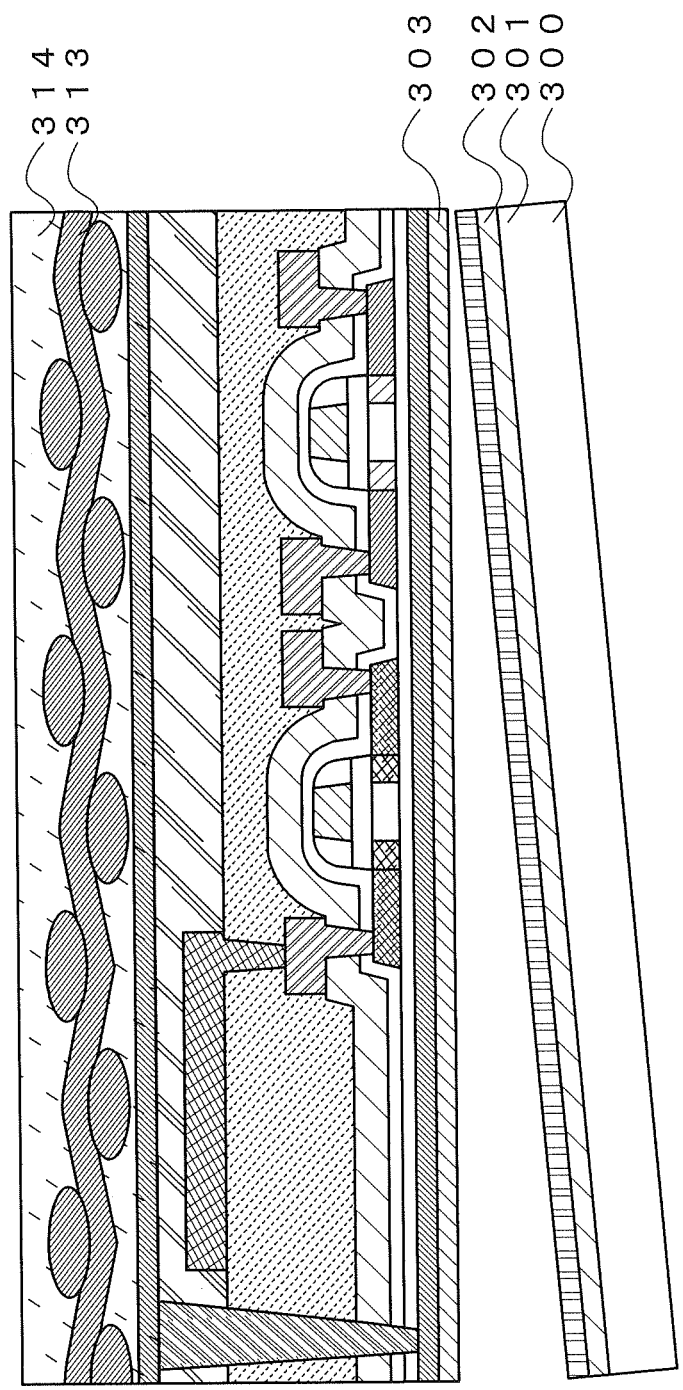
FIG. 9 illustrates an example of the method for manufacturing a semiconductor device.

Next, the first insulator in which the fibrous body 313 is impregnated with the organic resin 314 is thermally compressed over the second conductive film 502. Then, after the thermal compression, by application of physical force (pulling, pushing, or the like), a separation step of separating the substrate 300, the insulating film 301, and the metal film 302 is performed (see FIG. 9).

Figure 10:
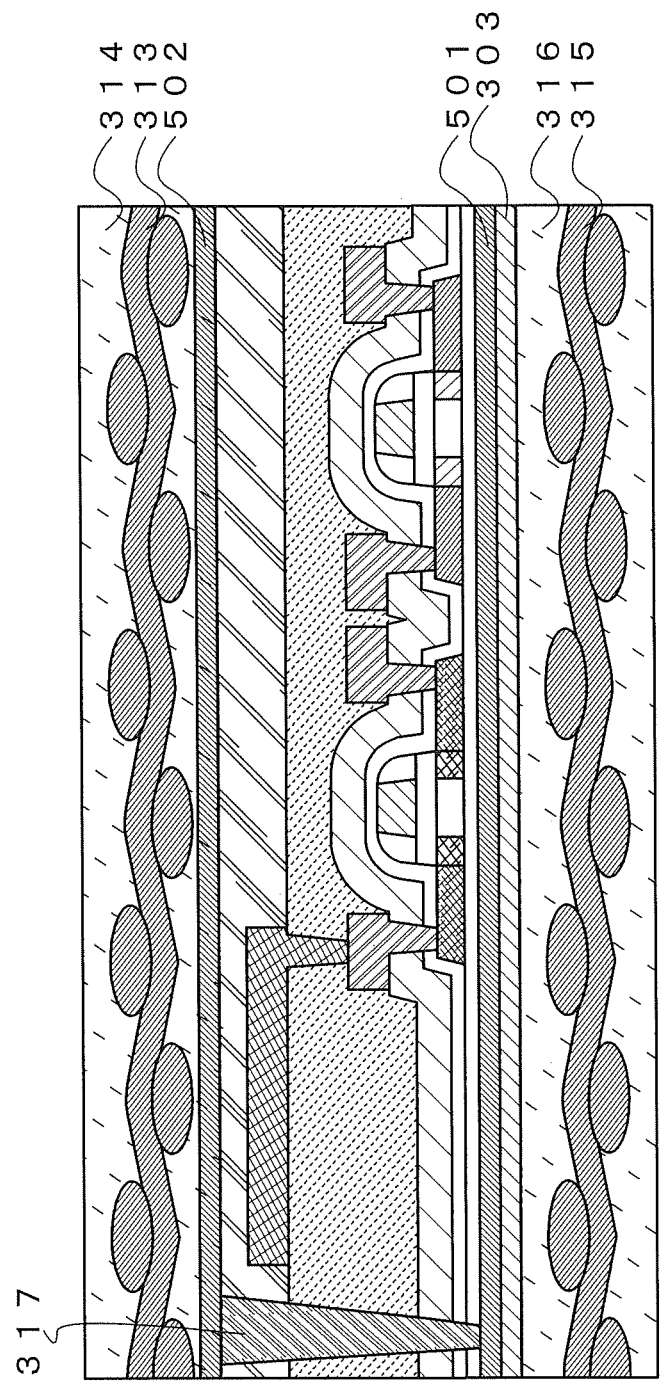
FIG. 10 illustrates an example of the method for manufacturing a semiconductor device.

Then, after the separation step, the second insulator in which the fibrous body 315 is impregnated with the organic resin 316 is thermally compressed below the insulating film 303 (see FIG. 10).

By using a structure where the first conductive film 501 and the second conductive film 502 are electrically connected to each other as described above, a potential of the first conductive film 501 and a potential of the second conductive film 502 are kept at the same level, so that electrostatic withstand voltage can be raised.

Note that the first conductive film 501 and the second conductive film 502 may be in contact with each other by using the second conductive film 502 without the formation of the conductor 317. Alternatively, after the second conductive film 502 is formed, the first conductive film 501 and the second conductive film 502 may be irradiated with laser light so as to be melted and be in contact with each other.

This embodiment can be combined with all the other embodiments.

Embodiment 6

Although the second conductive film is provided over the antenna in Embodiments 4 and 5, the second conductive film may be provided between the antenna and the circuit including the thin film transistor.

Specifically, a third conductive film 503 having an opening portion is provided over the third interlayer insulating film 310. A fourth interlayer insulating film 318 is formed over the third conductive film 503 so that the antenna and the third conductive film 503 are not short-circuited (see FIG. 11).

Note that the opening portion in the third conductive film 503 is larger than a contact hole provided in the fourth interlayer insulating film 318 so that the antenna and the third conductive film 503 are not short-circuited.

As the material of the fourth interlayer insulating film 318, a silicon oxide film, a silicon nitride film, an organic resin film, or the like can be used.

With the above structure, a conductive film which blocks the antenna is not provided. Thus, a problem of deviation of resonant frequency due to the conductive film can be prevented.

Note that in a manner similar to that of Embodiment 5, the first conductive film 501 and the third conductive film 503 may be electrically connected to each other through the contact hole.

Further, the material of the third conductive film 503 is similar to those of the first conductive film 501 and the second conductive film 502.

This embodiment can be combined with all the other embodiments.

Embodiment 7

Although the conductive films for countermeasures against electrostatic discharge are provided inside the first insulator and the second insulator in Embodiments 4 to 6, the conductive films for countermeasures against electrostatic discharge may be provided outside the first insulator and the second insulator.

Figure 12:
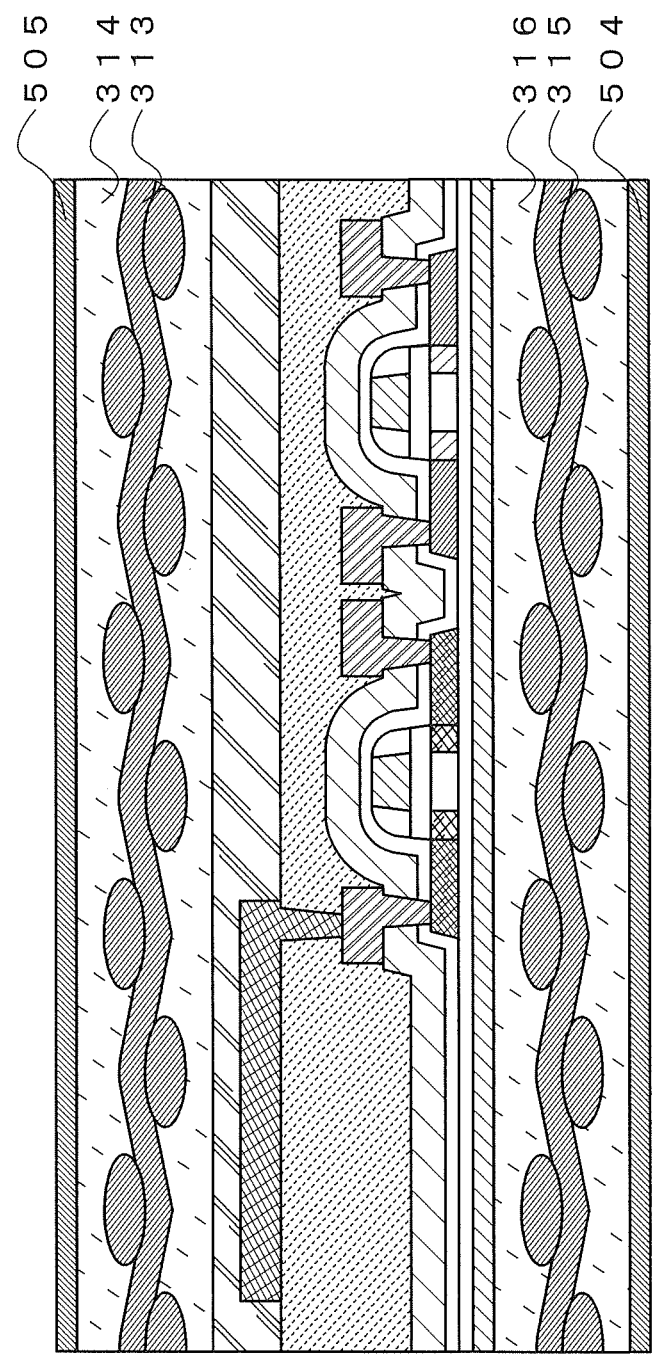
FIG. 12 illustrates an example of a semiconductor device.

Specifically, a fourth conductive film 504 is formed on a bottom surface of the second insulator in which the fibrous body 315 is impregnated with the organic resin 316, and a fifth conductive film 505 is formed on a top surface of the first insulator in which the fibrous body 313 is impregnated with the organic resin 314 (see FIG. 12).

As for a formation method, thermal compression may be performed after the conductive films are formed on the surfaces of the first insulator and the second insulator, or the conductive films may be formed after thermal compression is performed.

Figure 13:
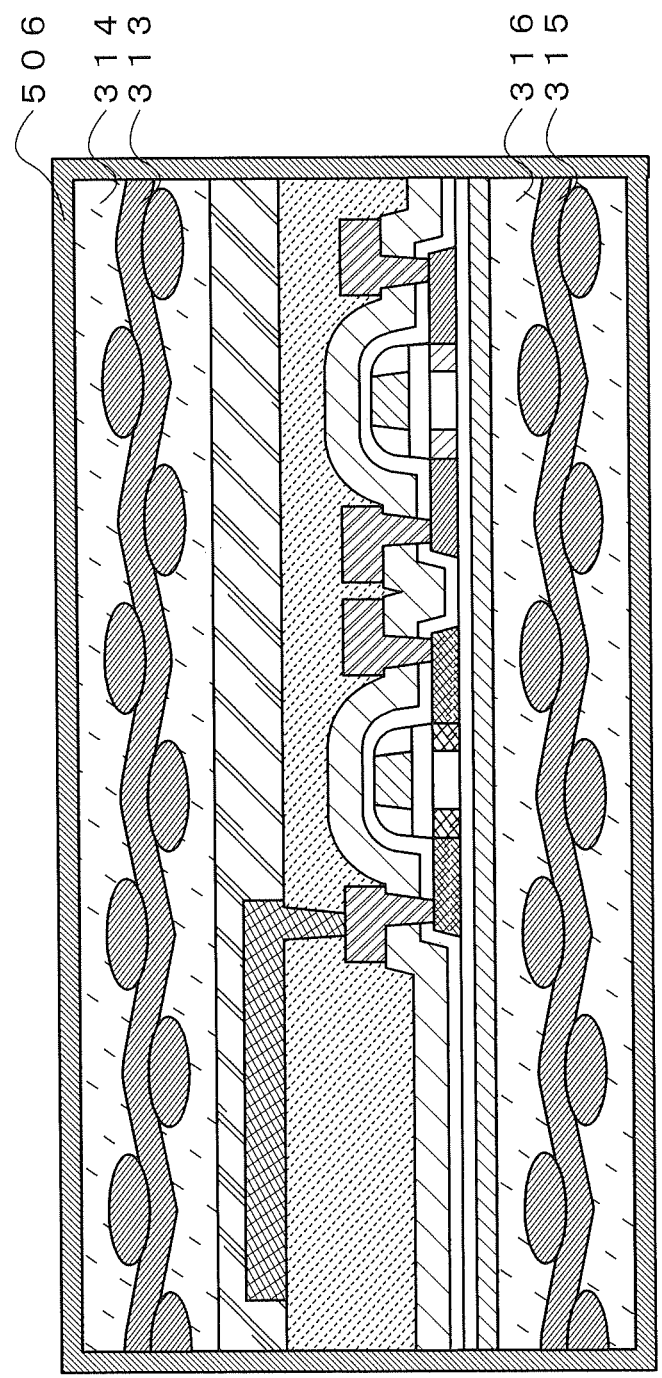
FIG. 13 illustrates an example of a semiconductor device.

In addition, the fourth conductive film 504 and the fifth conductive film 505 may be electrically connected to each other so as to be a sixth conductive film 506 (see FIG. 13).

As for a method for electrically connecting the fourth conductive film 504 and the fifth conductive film 505 to each other, conductive films may be formed on side surfaces, or the fourth conductive film 504 and the fifth conductive film 505 may be irradiated with laser light so as to be melted and be in contact with each other.

Further, the materials of the fourth to sixth conductive films are similar to those of the first conductive film 501 and the second conductive film 502.

This embodiment can be combined with all the other embodiments.

Embodiment 8

In order to improve an effect of increasing electrostatic withstand voltage, it is effective to lower the resistance value of a conductive film.

In order to lower the resistance value of the conductive film, the thickness of the conductive film is simply made larger.

However, if the thickness of a conductive film of an antenna is made larger, resonant frequency is deviated, so that communication distance is decreased.

Thus, as a transformed example of FIG. 13, a seventh conductive film 507 is formed in a position which does not overlap with the antenna 311*a*. Note that the seventh conductive film 507 and the wiring portion 311*b* may be provided in a position where they overlap with each other, or may be provided in a position where they do not overlap with each other (see FIG. 14).

Figure 14:
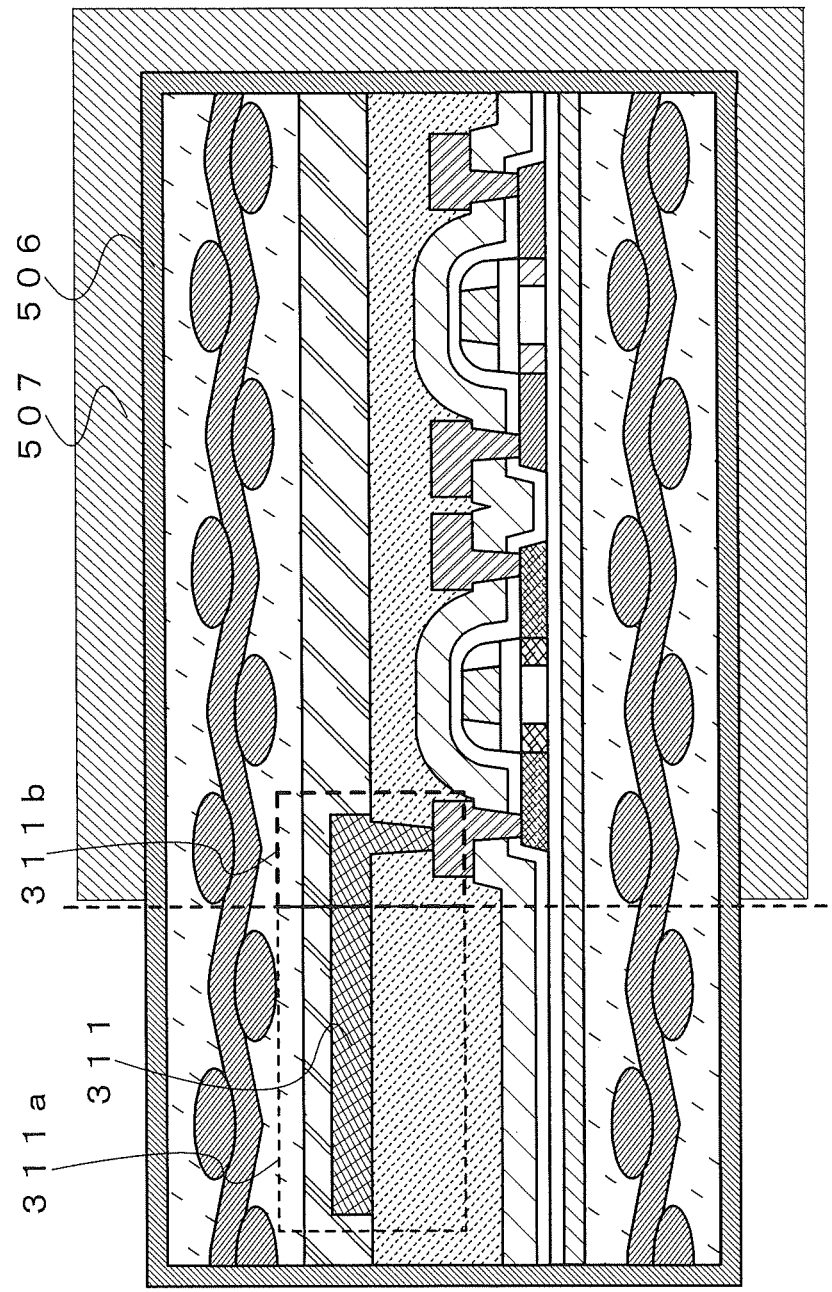
FIG. 14 illustrates an example of a semiconductor device.

With the structure of FIG. 14, deviation of resonant frequency in an antenna region can be kept to the minimum and an effect of increasing electrostatic withstand voltage can be improved.

Note that the thickness of the seventh conductive film 507 is preferably larger than that of the sixth conductive film 506.

Figure 15:
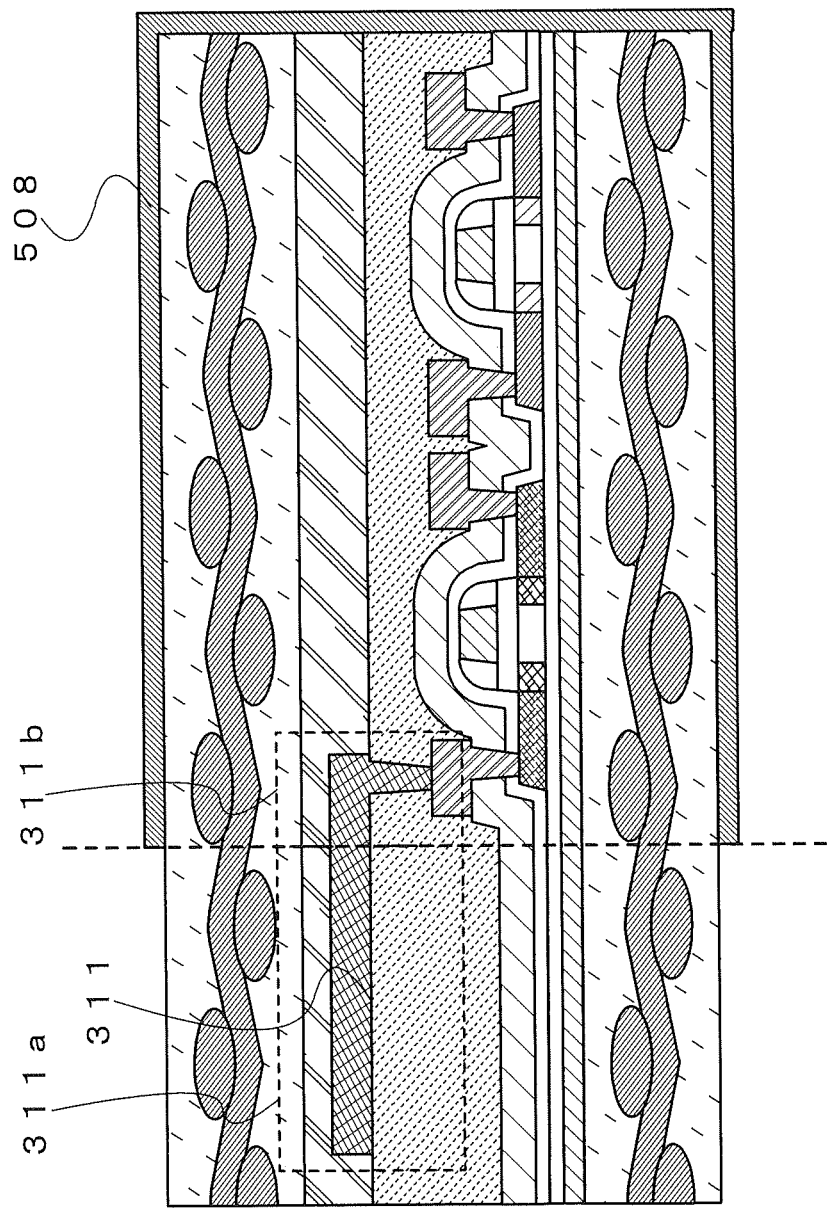
FIG. 15 illustrates an example of a semiconductor device.

In addition, an eighth conductive film 508 which has a shape where the conductive film provided in the position which overlaps with the antenna 311*a* is removed may be provided (see FIG. 15).

As a formation method of the seventh and eighth conductive films, a method by which a pattern is formed using a metal mask in deposition, a method by which a mask is formed by photolithography or the like after a conductive film is formed over the entire surface and then part of the conductive film is selectively removed, or the like can be used.

Further, the materials of the seventh and eighth conductive films are similar to those of the first conductive film 501 and the second conductive film 502. Note that although an example in which the conductive films are provided outside the insulators is illustrated in this embodiment, the structure of this embodiment may be used after the conductive films are provided inside the insulators. Furthermore, by forming a plurality of island-shaped conductive films, mesh conductive films, or the like as the conductive film provided in the region which overlaps with the antenna, electromagnetic waves are easily transmitted through slits, and conductive films may be provided over the entire surface in the other regions.

This embodiment can be combined with all the other embodiments.

Embodiment 9

An example where an impact diffusion layer is provided in Embodiments 1 to 8 is illustrated.

For the impact diffusion layer, an aramid resin, a polyethylene naphthalate (PEN) resin, a polyether sulfone (PES) resin, a polyphenylene sulfide (PPS) resin, a polyimide (PI) resin, or the like can be used.

The impact diffusion layer is preferably provided so as to be in contact with surfaces of the outside of the first insulator and the second insulator.

That is, with the structure, the impact diffusion layer is exposed, so that external pressing force durability is improved.

Note that in the case of a structure as in FIG. 12 or FIG. 13, the impact diffusion layer may be provided between a conductive film and an insulator, or may be provided on a surface of the outside of the conductive film.

In particular, when the impact diffusion layer is provided on the surface of the outside of the conductive film, the impact diffusion layer is exposed and the conductive film is not exposed.

Then, since the conductive film is protected against friction or the like with the impact diffusion layer, the conductive film can be prevented from being peeled due to friction, which is preferable.

As for a formation method, thermal compression may be performed after the impact diffusion layer is formed on the surfaces of the first insulator and the second insulator, or the impact diffusion layer may be formed after thermal compression is performed.

Note that in the case where the impact diffusion layer is provided on the surface of the conductive film, the impact diffusion layer may be provided after the conductive film is formed.

The impact diffusion layer can be provided by thermal compression or the like. A film-shaped impact diffusion layer may be attached by using an adhesive.

This embodiment can be combined with all the other embodiments.

Embodiment 10

In this embodiment, examples of a circuit of a semiconductor device and operation thereof are described.

Figure 18:
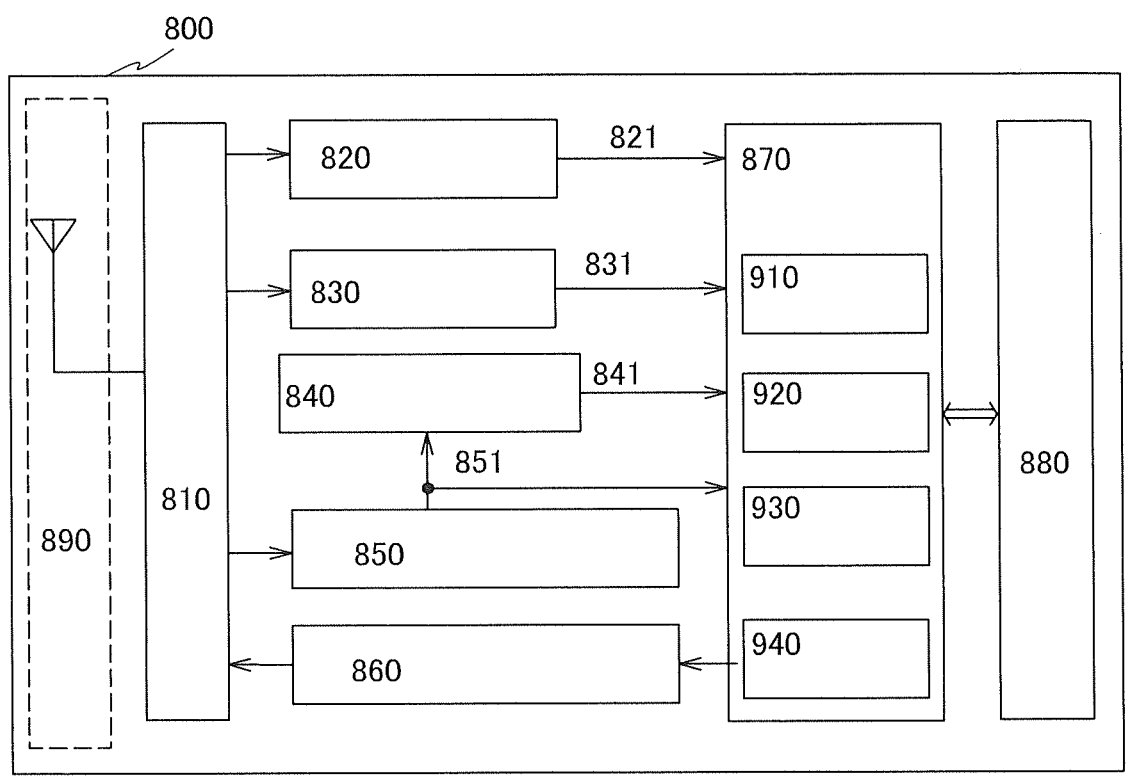
FIG. 18 illustrates an example of a circuit diagram.

A semiconductor device 800 which has a function of communicating data without contact includes a high-frequency circuit 810, a power supply circuit 820, a reset circuit 830, a clock generation circuit 840, a data demodulation circuit 850, a data modulation circuit 860, a control circuit 870 which controls another circuit, a memory circuit 880, and an antenna 890 (see FIG. 18).

The high-frequency circuit 810 is a circuit which receives a signal from the antenna 890 and outputs a signal received from the data modulation circuit 860 from the antenna 890.

The power supply circuit 820 is a circuit which generates a power supply potential from a received signal.

The reset circuit 830 is a circuit which generates a reset signal 831.

The clock generation circuit 840 is a circuit which generates a variety of clock signals 841 in accordance with a received signal which is input from the antenna 890.

The data demodulation circuit 850 is a circuit which demodulates a received signal and outputs the demodulated signal 851 to the control circuit 870.

The data modulation circuit 860 is a circuit which modulates a signal received from the control circuit 870.

In addition, the control circuit 870 includes, for example, a code extraction circuit 910, a code determination circuit 920, a CRC determination circuit 930, and an output unit circuit 940.

Note that the code extraction circuit 910 is a circuit which extracts each of a plurality of codes included in an instruction transmitted to the control circuit 870.

The code determination circuit 920 is a circuit which determines the content of an instruction by comparing an extracted code with a code which corresponds to a reference.

The CRC determination circuit 930 is a circuit which detects the presence or absence of a transmission error or the like in accordance with a determined code.

Next, an example of the operation of the above semiconductor device is described.

First, a radio signal is received by the antenna 890.

The radio signal is transmitted to the power supply circuit 820 through the high frequency circuit 810, and a high power supply potential (hereinafter referred to as VDD 821) is generated.

The VDD 821 is applied to each circuit included in the semiconductor device 800.

In addition, a signal transmitted to the data demodulation circuit 850 through the high frequency circuit 810 is demodulated, which is referred to as a demodulated signal.

Further, signals passed through the reset circuit 830 and the clock generation circuit 840 through the high-frequency circuit 810, and the demodulated signal are transmitted to the control circuit 870.

The signals transmitted to the control circuit 870 are analyzed by the code extraction circuit 910, the code determination circuit 920, the CRC determination circuit 930, and the like.

Then, based on the analyzed signals, information in the semiconductor device, which is stored in the memory circuit 880, is output.

The information in the semiconductor device, which is output, is encoded through the output unit circuit 940.

Further, the information in the semiconductor device 800, which is encoded, passes through the data modulation circuit 860 and then is transmitted by the antenna 890 as a wireless signal.

Note that a low power supply potential (hereinafter referred to as VSS) is common in the plurality of circuits included in the semiconductor device 800, and the VSS can be set to GND.

This embodiment can be combined with all the other embodiments.

Embodiment 11

The semiconductor devices for performing wireless communication through antennas (also referred to as RFID tags, wireless tags, IC chips, wireless chips, noncontact signal processing devices, or semiconductor integrated circuit chips) in Embodiments 1 to 10 can be attached to surfaces of products or living things (e.g., human beings, animals, or plants) or can be embedded inside products or living things (e.g., human beings, animals, or plants), for example.

By using the semiconductor device for performing wireless communication through the antenna, information management without contact becomes possible.

Communication of data without contact leads to an environment where users can utilize an information communication technology at any time and anywhere (ubiquitous computing).

This embodiment can be combined with all the other embodiments.

Example 1

In order to demonstrate an effect of countermeasures against electrostatic discharge, measurement of ESD (electrostatic discharge) was performed.

The measurement of ESD was performed as follows.

First, an aluminum plate was put on a glass substrate (0.5-nm-thick). Then, a conductive sheet was put on the aluminum plate, and a sample was put on the conductive sheet.

Then, from above the sample (chip), predetermined voltage was applied by using an ESD tester (manufactured by TAKAYA Corporation, for evaluating simple response).

Next, electricity of the sample (chip) to which the predetermined voltage was applied was removed for one minute.

After that, whether or not the sample (chip) from which the electricity was removed operated was determined.

Then, by increasing the predetermined voltage from 1 kV to 15 kV, voltage at which the sample (chip) was not able to operate was measured.

In addition, the measurement was performed in two cases: the case where voltage was applied from a front surface (an antenna side) of the sample (chip) and the case where voltage was applied from a rear surface (a thin film transistor side) of the sample (chip).

Note that it was determined that a sample (chip) which operated after a voltage of 15 kV was applied had at least an electrostatic withstand voltage of 15 kV or higher.

Here, the sample on which the measurement was performed is described.

(A comparison structure: a structure where a conductive film for countermeasures against electrostatic discharge is not provided)

As a comparison structure, a structure was used in which a first insulator 11, a circuit 12 including a thin film transistor provided over the first insulator 11, an antenna 13 which is provided over the circuit 12 including the thin film transistor and is electrically connected to the circuit 12 including the thin film transistor, a protective film 14 (a silicon nitride film) provided over the antenna 13, and a second insulator 15 provided over the protective film 14 were provided (see FIG. 17A).

In the comparison structure, a conductive film for countermeasures against electrostatic discharge was not provided.

Note that as each of the first insulator and the second insulator, a prepreg (20-μm-thick) which was a structural body in which a fibrous body (a glass fiber) was impregnated with an organic resin (a brominated epoxy resin) was used.

Samples which were manufactured are described below.

(First structure: a structure where a conductive film for countermeasures against electrostatic discharge is provided on only a front surface side (an antenna side))

As a first structure, a structure was used in which a conductive film 16 for countermeasures against electrostatic discharge was provided on only a front surface side (an antenna side) of the comparison structure (see FIG. 17B).

The structure of a thin film transistor, the structure of a circuit, the shape of an antenna, a manufacturing material, and the like of the first structure were the same as those of the comparison structure.

A sample in which a 10-nm-thick titanium (Ti) film was formed as the conductive film was formed.

(Second structure: a structure where a conductive film for countermeasures against electrostatic discharge is provided on only a rear surface side (a thin film transistor side))

As a second structure, a structure was used in which a conductive film 17 for countermeasures against electrostatic discharge was provided on only a rear surface side (a thin film transistor side) of the comparison structure (see FIG. 17C).

The structure of a thin film transistor, the structure of a circuit, the shape of an antenna, a manufacturing material, and the like of the second structure were the same as those of the comparison structure.

A sample in which a 10-nm-thick titanium (Ti) film was formed as the conductive film was formed.

(Third structure: a structure where conductive films for countermeasures against electrostatic discharge are provided on a front surface side (an antenna side) and a rear surface side (a thin film transistor side) (conduction between the top and the bottom is not provided))

As a third structure, a structure was used in which a conductive film 18 and a conductive film 19 for countermeasures against electrostatic discharge were provided on a front surface side (an antenna side) and a rear surface side (a thin film transistor side) of the comparison structure (see FIG. 17D).

The structure of a thin film transistor, the structure of a circuit, the shape of an antenna, a manufacturing material, and the like of the third structure were the same as those of the comparison structure.

Note that the conductive film on the front surface side (the antenna side) and the conductive film on the rear surface side (the thin film transistor side) were electrically isolated from each other.

A sample in which a 10-nm-thick titanium (Ti) film was formed as the conductive film and a sample in which a 10-nm-thick indium tin oxide (ITO (containing $SiO_2$)) film containing silicon oxide was formed as the conductive film were formed.

(Fourth structure: a structure where conductive films for countermeasures against electrostatic discharge are provided on a front surface side (an antenna side) and a rear surface side (a thin film transistor side) (conduction between the top and the bottom is provided))

As a fourth structure, by providing conductive films for countermeasures against electrostatic discharge on a front surface side (an antenna side) and a rear surface side (a thin film transistor side) of the comparison structure and electrically connecting the conductive films to each other, a structure was used in which the first insulator 11, the circuit 12 including the thin film transistor, the antenna 13, the protective film 14, and the second insulator 15 were surrounded by a conductive film 20 (see FIG. 17E).

The structure of a thin film transistor, the structure of a circuit, the shape of an antenna, a manufacturing material, and the like of the fourth structure were the same as those of the comparison structure.

Note that the conductive film on the front surface side (the antenna side) and the conductive film on the rear surface side (the thin film transistor side) were electrically connected to each other.

A sample in which a 10-nm-thick titanium (Ti) film was formed as the conductive film, a sample in which a 10-nm-thick indium tin oxide (ITO (containing $SiO_2$)) film containing silicon oxide was formed as the conductive film, and a sample in which a 100-nm-thick indium tin oxide (ITO (containing $SiO_2$)) film containing silicon oxide was formed as the conductive film were formed.

(Fifth structure: a structure where conductive films for countermeasures against electrostatic discharge are provided on a front surface side (an antenna side) and a rear surface side (a thin film transistor side) of the inside of an insulator)

As a fifth structure, a structure was used in which conductive films 21 and 22 for countermeasures against electrostatic discharge were provided inside the insulator of the comparison structure. Specifically, the conductive film 21 was provided between the first insulator and the circuit including the thin film transistor, and the conductive film 22 was provided between the second insulator and the protective film (see FIG. 17F).

The structure of a thin film transistor, the structure of a circuit, the shape of an antenna, a manufacturing material, and the like of the fifth structure were the same as those of the comparison structure.

Note that the conductive film on the front surface side (the antenna side) and the conductive film on the rear surface side (the thin film transistor side) were electrically connected to each other.

A sample in which a 10-nm-thick indium tin oxide (ITO (containing $SiO_2$)) film containing silicon oxide was formed as the conductive film was formed.

(Sixth structure: a structure where a conductive film for countermeasures against electrostatic discharge is provided on only a front surface side (an antenna side) of the inside of an insulator)

As a sixth structure, a structure was used in which a conductive film 23 for countermeasures against electrostatic discharge was provided inside the insulator of the comparison structure. Specifically, the conductive film 23 was provided between the second insulator and the protective film (see FIG. 17G).

The structure of a thin film transistor, the structure of a circuit, the shape of an antenna, a manufacturing material, and the like of the sixth structure were the same as those of the comparison structure.

A sample in which a 10-nm-thick indium tin oxide (ITO (containing $SiO_2$)) film containing silicon oxide was formed as the conductive film was formed.

(Measurement Results and Consideration)

The measurement results of the comparison structure and the first to sixth structures are illustrated in FIG. 19.

Note that the result of the comparison structure is an average value of four samples. The result of each of the first to sixth structures is an average value of five samples.

When the result of the comparison structure and the result of each of the first to sixth structures are compared with each other, it is found that electrostatic withstand voltage is increased with respect to application of voltage from a surface on which a conductive film for countermeasures against electrostatic discharge is provided.

Therefore, it is clear that electrostatic withstand voltage is increased by providing a conductive film.

Thus, in the case of a semiconductor device which can transmit and receive radio waves to and from opposite surfaces like an IC card, conductive films are preferably provided on both a front surface and a rear surface.

Needless to say, since there is an effect of increasing electrostatic withstand voltage even in the case where a conductive film is provided on only a single surface, the present invention is not limited to the case where conductive films are provided on both a front surface and a rear surface.

In addition, from the measurement results of the comparison structure (FIG. 17A), the first structure (FIG. 17B), and the sixth structure (FIG. 17G), it can be understood that each chip has lower electrostatic withstand voltage on the rear surface side (the thin film transistor side).

The reason for this is that the chip cannot operate because the thin film transistor or a wiring used for the circuit is damaged by static electricity.

Therefore, in the case where a conductive film is provided on only a single surface, the conductive film is preferably provided on the rear surface side (the thin film transistor side).

In addition, from the measurement results of the comparison structure (FIG. 17A), the fifth structure (FIG. 17F), and the sixth structure (FIG. 17G), it can be understood that there is an effect of increasing electrostatic withstand voltage even in the case where a conductive film is provided inside an insulator.

Further, since each of the indium tin oxide film containing silicon oxide and the titanium film has an effect of increasing electrostatic withstand voltage, it can be understood that any conductive film has an effect of increasing electrostatic withstand voltage regardless of materials.

Furthermore, in the fourth structure (FIG. 17E), an effect of increasing electrostatic withstand voltage is further improved in the case where the thickness of the conductive is made larger (in the case where the resistance value of the conductive film is made lower).

Therefore, it can be understood that an effect of increasing electrostatic withstand voltage is further improved in the case where the resistance value of the conductive film is lower.

In addition, the electrostatic withstand voltage of the fourth structure (FIG. 17E) and the fifth structure (FIG. 17F) is extremely higher than that of the other structures. The average of the electrostatic withstand voltage of the other structures is in the single digits (lower than 10 kV); however, the average of the electrostatic withstand voltage of the structures 4 and 5 is in the two digits (higher than 10 kV).

This point can be explained by consideration of dielectric polarization.

That is, each sample of this example includes the first insulator and the second insulator.

Thus, since dielectric polarization is generated when one of surfaces of the first insulator or the second insulator is charged, the other of the surfaces is charged to polarity opposite to that of the one of the surfaces.

Then, since current flows to the circuit provided between the first insulator and the second insulator when dielectric polarization is generated, the circuit is damaged by static electricity in some cases.

On the other hand, with a structure in which a conductive film on a front surface and a conductive film on a rear surface are electrically connected to each other like the fourth structure (FIG. 17E) and the fifth structure (FIG. 17F), a potential of the conductive film on the front surface and a potential of the conductive film on the rear surface are kept at the same level.

Thus, in the structure in which the conductive film on the front surface and the conductive film on the rear surface are electrically connected to each other, even when one of surfaces of the first insulator or the second insulator is charged, the other of the surfaces is charged to the same potential as the one of the surfaces.

Therefore, since an adverse effect of electrostatic discharge due to dielectric polarization can be reduced in the fourth structure (FIG. 17E) and the fifth structure (FIG. 17F), electrostatic withstand voltage is further increased as compared to the other structures.

Note that needless to say, the present invention is not limited to the structures of this example.

Note that in the fourth structure, all the peripheral surfaces are surrounded by the conductive film, as illustrated in FIG. 17E; however, it is clear from the results of this example that any structure can reduce an adverse effect of dielectric polarization as long as it is a structure in which a conductive film on a front surface and a conductive film on a rear surface are electrically connected to each other.

As described above, the present inventors were able to obtain novel findings from the experimental results of this example.

Example 2

In Example 1, it is described that an effect of increasing electrostatic withstand voltage is improved by making the thickness of the conductive film larger.

On the other hand, change in resonant frequency of the circuit due to increase in thickness of the conductive film is a concern.

That is, a wireless chip operates by input of a radio wave having certain frequency from the outside.

In addition, when the resonant frequency of the circuit is similar to the frequency of a radio wave which is input from the outside, the wireless chip easily operates.

On the other hand, when the resonant frequency of the circuit is not similar to the frequency of a radio wave which is input from the outside, the wireless chip does not easily operate.

Further, the resonant frequency can be set by a designer in accordance with the number of winding of the antenna or circuit design.

Accordingly, by providing the conductive film, if actual resonant frequency deviates from resonant frequency which is set by the designer, the performance of the wireless chip is decreased.

Thus, in this example, an adverse effect on resonant frequency due to difference in thickness of a conductive film was examined.

As samples, the sample of the comparison structure in Example 1, the sample in which the 10-nm-thick indium tin oxide (ITO (containing $SiO_2$)) film containing silicon oxide was formed in the fourth structure (FIG. 17E) in Example 1, and the sample in which the 100-nm-thick indium tin oxide (ITO (containing $SiO_2$)) film containing silicon oxide was formed in the fourth structure in Example 1 were formed.

Note that the samples were formed so that structures other than the structures and the thickness of the conductive films were all the same.

Measurement results are as follows.

In the sample of the comparison structure (FIG. 17A) where the conductive film is not provided, resonant frequency was 15.5 MHz.

In the sample where the thickness of the conductive film is 10 nm in the fourth structure (FIG. 17E), resonant frequency was 14.3 MHz.

In the sample where the thickness of the conductive film is 100 nm in the fourth structure (FIG. 17E), resonant frequency was 13.0 MHz.

From the above results, it was found that as the thickness of the conductive film became larger, deviation of resonant frequency became larger.

From the results of this example, in order to improve an effect of preventing electrostatic discharge and to reduce an adverse effect of resonant frequency, a structure was came up in which the thickness of a conductive film in a region overlapping with an antenna is made smaller than those of conductive films in the other regions (see FIG. 14).

Alternatively, the conductive film in the region overlapping with the antenna may be removed (see FIG. 15).

Note that in the case where the conductive film is removed, electric charge is more likely to be accumulated in the region locally. Thus, as illustrated in FIG. 14, a thin conductive film is preferably provided in the region overlapping with the antenna.

Figure 11:
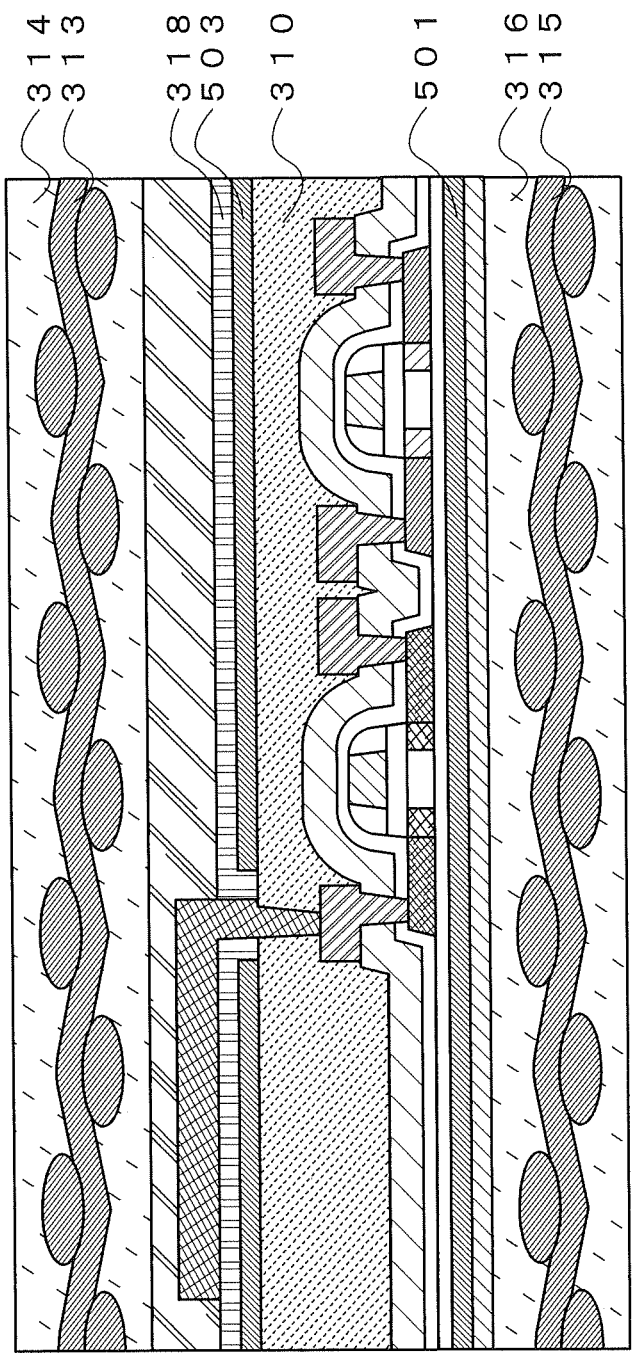
FIG. 11 illustrates an example of a semiconductor device.

Alternatively, a conductive film may be provided between the antenna and the circuit including the thin film transistor (see FIG. 11).

This application is based on Japanese Patent Application serial no. 2008-239078 filed with Japan Patent Office on Sep. 18, 2008 and Japanese Patent Application serial no. 2008-239075 filed with Japan Patent Office on Sep. 18, 2008, the entire contents of which are hereby incorporated by reference.

EXPLANATION OF REFERENCE

11: first insulator, 12: circuit including thin film transistor, 13: antenna, 14: protective film, 15: second insulator, 16: conductive film, 17: conductive film, 18: conductive film, 19: conductive film, 20: conductive film, 21: conductive film, 22: conductive film, 23: conductive film, 101: organic resin, 102: fibrous body, 103: first conductive film, 104: first insulating film, 105: layer including circuit having thin film transistor, 106: layer including antenna, 107: second insulating film, 108: second conductive film, 109: organic resin, 110: fibrous body, 111: conductor, 112: conductor, 201: first insulator, 202: layer including circuit over base insulating film, 203: layer including antenna, 204: protective film, 205: second insulator, 206: conductive film, 207: conductive film, 208: conductive film, 209: conductive film, 210: conductive film, 211: conductive film, 212: conductive film, 300: substrate, 301: insulating film, 302: metal film, 303: insulating film, 304: first insulating film, 305: thin film transistor, 305a: semiconductor layer, 305b: gate insulating film, 305c: gate electrode, 305d: sidewall, 305e: sidewall, 306: thin film transistor, 306a: semiconductor layer, 306b: gate insulating film, 306c: gate electrode, 306d: sidewall, 306e: sidewall, 307: first interlayer insulating film, 308: second interlayer insulating film, 309a: wiring, 309b: wiring, 309c: wiring, 309d: wiring, 310: third interlayer insulating film, 311: layer including antenna, 311a: antenna, 311b: wiring portion, 312: second insulating film, 313: fibrous body, 314: organic resin, 315: fibrous body, 316: organic resin, 317: conductor, 318: fourth interlayer insulating film, 400: fibrous body, 401: organic resin, 501: first conductive film, 502: second conductive film, 503: third conductive film, 504: fourth conductive film, 505: fifth conductive film, 506: sixth conductive film, 507: seventh conductive film, 508: eighth conductive film, 800: semiconductor device, 810: high-frequency circuit, 820: power supply circuit, 830: reset circuit, 840: clock generation circuit, 850: data demodulation circuit, 860: data modulation circuit, 870: control circuit, 880: memory circuit, and 890: antenna

What is claimed is:

1. A semiconductor device comprising:
a first insulator;
a thin film transistor over the first insulator;
a first conductive layer over the thin film transistor;
a second conductive layer over the first conductive layer, the second conductive layer including an antenna portion and a wiring portion; and
a second insulator over the second conductive layer,
wherein the wiring portion of the second conductive layer is electrically connected to the thin film transistor.

2. The semiconductor device according to claim 1, further comprising a third conductive layer provided between the first insulator and the thin film transistor.

3. The semiconductor device according to claim 1, wherein the thin film transistor is included in a layer having a circuit provided over the first insulator.

4. The semiconductor device according to claim 1,
wherein the first insulator comprises a first organic resin and a first fibrous body, and
wherein the second insulator comprises a second organic resin and a second fibrous body.

5. The semiconductor device according to claim 4,
wherein the first organic resin includes a plurality of first conductive particles, and
wherein the second organic resin includes a plurality of second conductive particles.

6. The semiconductor device according to claim 4,
wherein each of the first fibrous body and the second fibrous body comprises one of a polyvinyl alcohol fiber, a polyester fiber, a polyamide fiber, a polyethylene fiber, an aramid fiber, a polyparaphenylene benzobisoxazole fiber, a glass fiber, and a carbon fiber.

7. The semiconductor device according to claim 1,
wherein the first conductive layer comprises at least one of titanium, molybdenum, tungsten, aluminum, titanium nitride, tantalum nitride, tungsten nitride, indium oxide, and indium tin oxide.

8. The semiconductor device according to claim 1,
wherein the second conductive layer comprises at least one of titanium, molybdenum, tungsten, aluminum, copper, silver, gold, nickel, platinum, palladium, iridium, rhodium, tantalum, cadmium, zinc, and iron.

9. A semiconductor device comprising:
a first insulator;
a thin film transistor over the first insulator;
a first conductive layer over the thin film transistor;
a second conductive layer over the first conductive layer, the second conductive layer including an antenna portion and a wiring portion; and
a second insulator over the second conductive layer,
wherein the antenna portion has at least one of a linear shape, a curved shape, a meandering shape, a coiled shape, and a ribbon shape, and
wherein the wiring portion of the second conductive layer is electrically connected to the thin film transistor.

10. The semiconductor device according to claim 9, further comprising a third conductive layer provided between the first insulator and the thin film transistor.

11. The semiconductor device according to claim 9, wherein the thin film transistor is included in a layer having a circuit provided over the first insulator.

12. The semiconductor device according to claim 9,
wherein the first insulator comprises a first organic resin and a first fibrous body, and
wherein the second insulator comprises a second organic resin and a second fibrous body.

13. The semiconductor device according to claim 12,
wherein the first organic resin includes a plurality of first conductive particles, and
wherein the second organic resin includes a plurality of second conductive particles.

14. The semiconductor device according to claim 12,
wherein each of the first fibrous body and the second fibrous body comprises one of a polyvinyl alcohol fiber, a polyester fiber, a polyamide fiber, a polyethylene fiber, an aramid fiber, a polyparaphenylene benzobisoxazole fiber, a glass fiber, and a carbon fiber.

15. The semiconductor device according to claim 9,
wherein the first conductive layer comprises at least one of titanium, molybdenum, tungsten, aluminum, titanium nitride, tantalum nitride, tungsten nitride, indium oxide, and indium tin oxide.

16. The semiconductor device according to claim 9, wherein the second conductive layer comprises at least one of titanium, molybdenum, tungsten, aluminum, copper, silver, gold, nickel, platinum, palladium, iridium, rhodium, tantalum, cadmium, zinc, and iron.

* * * * *